(12) United States Patent  
Mochizuki et al.

(10) Patent No.: US 7,574,311 B2  
(45) Date of Patent: Aug. 11, 2009

(54) TIME INTERVAL MEASURING APPARATUS AND JITTER MEASURING APPARATUS USING THE SAME

(75) Inventors: Ken Mochizuki, Atsugi (JP); Osamu Sugiyama, Zama (JP); Tadanori Nishikobara, Atsugi (JP)

(73) Assignee: Anritsu Corporation, Tokyo (JP)

( * ) Notice: Subject to any disclaimer, the term of this patent is extended or adjusted under 35 U.S.C. 154(b) by 353 days.

(21) Appl. No.: 11/660,116

(22) PCT Filed: Jun. 16, 2006

(86) PCT No.: PCT/JP2006/312158

§ 371 (c)(1),  
(2), (4) Date: Feb. 12, 2007

(87) PCT Pub. No.: WO2006/135058

PCT Pub. Date: Dec. 21, 2006

(65) Prior Publication Data

US 2008/0172194 A1    Jul. 17, 2008

(30) Foreign Application Priority Data

Jun. 17, 2005    (JP)    ............................. 2005-178405

(51) Int. Cl.  
G06F 19/00    (2006.01)

(52) U.S. Cl. ..................................... 702/69; 324/76.16

(58) Field of Classification Search .................... 702/66, 702/69, 70, 71, 73, 75–78, 106, 108, 110, 702/124, 125, 126, 183, 189, 190, 193, 197, 702/198; 324/76.12, 76.15, 76.19, 76.21, 324/76.22, 76.24, 76.29, 76.38, 76.55, 76.61, 324/76.33, 76.16; 708/845, 819, 820, 821, 708/847, 815

See application file for complete search history.

(56) References Cited

U.S. PATENT DOCUMENTS 6,993,101 B2 * 1/2006 Trachewsky et al. ........ 375/343  
7,248,981 B2 * 7/2007 Mochizuki .................. 702/69  
7,342,986 B2 * 3/2008 Nakamura et al. .......... 375/376  
7,469,367 B2 * 12/2008 Nakamura et al. .......... 714/709

FOREIGN PATENT DOCUMENTS

| JP | 5-215873 A | 8/1993 |
| JP | 8-146062 A | 6/1996 |
| JP | 2002-107394 A | 4/2002 |
| WO | WO 00/46606 A1 | 8/2000 |
| WO | WO 02/103377 A1 | 12/2002 |

OTHER PUBLICATIONS

Notification Concerning Transmittal of International Preliminary Report on Patentability, Chapter I of the Patent Cooperation Treaty for PCT/JP2006/312158, and Written Opinion, 5 sheets.

* cited by examiner

*Primary Examiner*—Edward Raymond  
(74) *Attorney, Agent, or Firm*—Frishauf, Holtz, Goodman & Chick, P.C.

(57) ABSTRACT

In order to stably measure an input interval time of a pulse signal with high precision, a time interval measuring apparatus includes a reference signal generator, a phase shifter, first and second A/D converters, an error correction unit, an instantaneous phase calculation unit, and an interval time calculation unit. The phase shifter divides a reference signal of a sine wave having a predetermined frequency from the reference signal generator into a first analog signal and a second analog signal having phases shifted to each other. The first and second A/D converters perform sampling of the first analog signal and the second analog signal from the phase shifter, respectively, at an input timing of a pulse signal to be measured, and output a first and second digital sample values. The error correction unit corrects direct current offset errors generated in, respectively, the first and second digital sample values output from the first and second A/D converters, a phase error with respect to 90°, and an amplitude error. The instantaneous phase calculation unit calculates an instantaneous phase of the reference signal based on the corrected first and second digital sample values. The interval time calculation unit determines an input interval time of the pulse signal based on a variation of instantaneous phases.

40 Claims, 12 Drawing Sheets

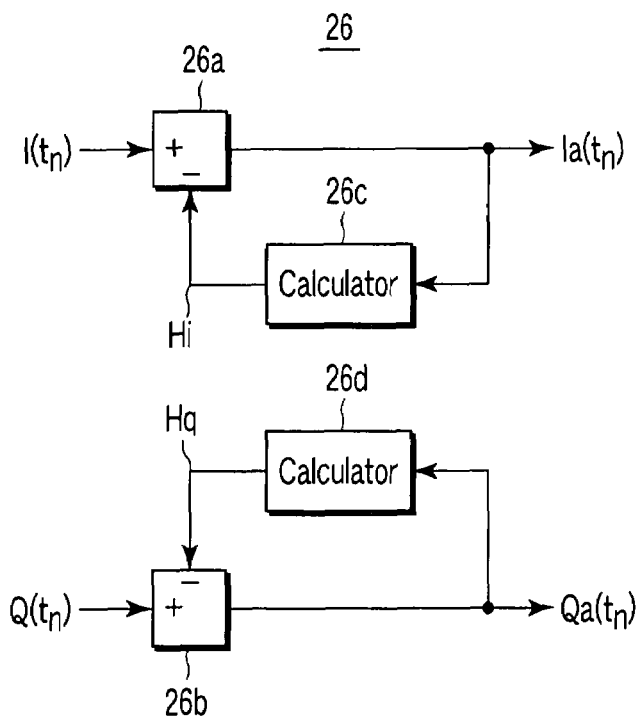
F I G. 2
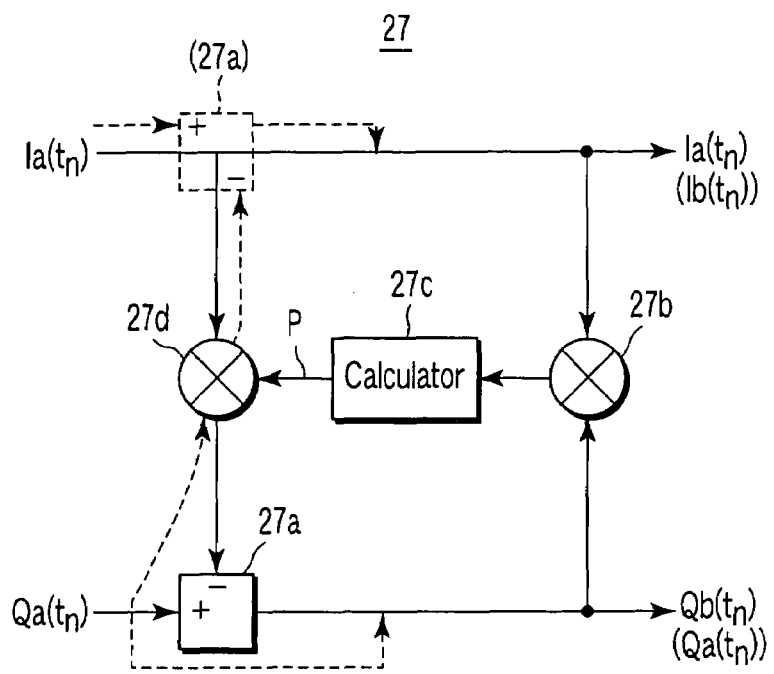
F I G. 3

TIME INTERVAL MEASURING APPARATUS AND JITTER MEASURING APPARATUS USING THE SAME

This application is a U.S. National Phase Application under 35 USC 371 of International Application PCT/JP2006/312158 filed Jun. 16, 2006.

TECHNICAL FIELD

The present invention relates to a time interval measuring apparatus and a jitter measuring apparatus using the same. In particular, the present invention relates to a time interval measuring apparatus which adopts a technology for accurately measuring an input interval time of a pulse signal with a high resolution, and a jitter measuring apparatus which uses the time interval measuring apparatus.

BACKGROUND ART

As a technique for measuring a phase fluctuation (jitters) of a pulse signal such as a data signal or a clock signal, there is known a time interval measuring method for measuring an interval time between a rising portion and a falling portion of the pulse signal.

In such a time interval measuring method, it is demanded that the measurement thereof should be more precise along with an increase in a data transmission rate in recent years.

For example, since an interval between bits of a digital signal of 1 Gbps is 1 nsec, at least 100 psec of the measurement precision is required in the case of the time interval measurement method in which this digital signal is set as an object of measurement.

As the most simple method for measuring an input interval time of a pulse signal, there is provided a so-called period measurement method for counting a high frequency signal having a stable frequency from an input timing (a timing of a rise and a fall) of a pulse signal to be measured up to the next input timing thereof.

However, in order to measure the period in a precision of 100 psec as described above, it is required to prepare a counter which directly counts a high frequency signal having a frequency of tens of GHz or more without dividing the frequency. Under these circumstances, it is difficult to adopt such a measurement method.

As a method for solving this problem, there is known a technique for measuring in a high precision an input interval time of a pulse signal with a combination of the period measurement method and a phase measurement method for measuring a phase variation of an analog signal having a predetermined period.

FIG. 12 is a view showing a configuration of a conventional time interval measuring apparatus 10 in which the period measurement method and the phase measurement method are combined.

A reference signal generator 11 in the time interval measurement apparatus 10 generates an analog reference signal r(t) having a predetermined frequency number fr (a period Tr) and a clock signal c which is synchronized in phase with the reference signal r(t) at the same frequency.

As the reference signal r(t), a trapezoid wave is used. In the trapezoid wave, for example, as shown in (a) of FIG. 13, when one period of the reference signal r(t) is set to Tr, the voltage is monotonously increased from 0 to V with a constant inclination within the range of the first (Tr/4) period (a phase of 0 to π/2); the voltage is set to a definite level of V within the range of the next (Tr/4) period (a phase of π/2 to π); the voltage is monotoneously decreased from V to 0 with a constant inclination within the range of the next (Tr/4) period (a phase of π to 3π/2); and furthermore, the voltage is set to a definite level of 0 within the range of the next (Tr/4) period (phase of 3π/2 to 2π).

A phase shifter 12 to which this reference signal r(t) is input generates a first analog signal i(t) and a second analog signal q(t) which have the same waveform as that the reference signal r(t) and which have phases mutually different through 90 degrees as shown in (b) and (c) of FIG. 13. The phase shifter 12 outputs the first analog signal i(t) to a first analog/digital (A/D) converter 13, and outputs the second analog signal q(t) to a second A/D converter 14.

Here, as shown in (a) and (b) of FIG. 13, the first analog signal i(t) and the reference signal r(t) are made to have the same phase.

Furthermore, it has been explained that each of the A/D converters 13 and 14 incorporates a track hold (a sample hold) circuit (not shown). In the case where an A/D converter which incorporates no track hold circuit, an independent track hold circuit is provided on the front stage thereof.

To both A/D converters 13 and 14, a pulse signal p to be measured is commonly input.

The first A/D converter 13 performs sampling of the first analog signal i(t) at an input timing $t_n$ (for example, a rise timing) of a pulse signal p shown in (d) of FIG. 13, and converts its analog sample value $i(t_n)$ into a digital sample value $I(t_n)$ to output the value as shown in (e) of FIG. 13 (n=1, 2, 3, . . . ).

Further, the second A/D converter 14 performs sampling of the second analog signal q(t) at the input timing $t_n$ (for example, the rise timing) of the pulse signal p shown in (d) of FIG. 13 in the same manner, and converts its analog digital sample value $Q(t_n)$ into a digital sample value $Q(t_n)$ to output the value as shown in (f) of FIG. 13 (n=1, 2, 3, . . . ).

The instantaneous phase calculator 15 determines an instantaneous phase $\phi(t_n)$ in one period of the reference signal r(t) at the time of the input of the pulse signal (p) based on the digital sample values $I(t_n)$ and $Q(t_n)$ which are output from both the A/D converters 13 and 14, and outputs the instantaneous phase as shown in (g) of FIG. 13.

Here, the first analog signal i(t) and the second analog signal q(t) have the same waveform as the reference signal r(t), and have a trapezoid-shaped waveform in which the inclination thereof changes in each of π/2 as described above. Besides, since the two analog signals have phases which are shifted for each of π/2, the phase can be specified from the two digital sample values $I(t_n)$ and $Q(t_n)$.

That is, like the case of time t1 of FIG. 13D, in the case where the digital sample value $I(t_n)$ is set within the range of 0 or more and less than V, and the digital sample value $Q(t_n)$ is set to 0, the instantaneous phase $\phi(t_n)$ is set to the range of 0 or more and less than π/2, and the instantaneous phase can be determined from the following calculation:

$$\phi(t_n) = (\pi/2) \cdot I(t_n)/V.$$

In addition, when the digital sample value $I(t_n)$ is set to V and the digital sample value $Q(t_n)$ is set to the range of 0 or more and less than V, the instantaneous phase $\phi(t_n)$ is set to the range of π/2 or more and less than π, and can be determined from the following calculation:

$$\phi(t_n) = (\pi/2) + (\pi/2) \cdot Q(t_n)/V.$$

Further, like the case of time t2 as shown in (d) of FIG. 13, when the digital sample value $I(t_n)$ is set to the range of V or less and more than 0 and the digital sample value $Q(t_n)$ is set to V, the instantaneous phase $\phi(t_n)$ is set to the range of π or more and less than 3π/2, and the instantaneous phase can be determined from the following calculation:

$$\phi(t_n)=\pi+(\pi/2)\cdot[V-I(t_n)]/V.$$

Furthermore, when the digital sample value $I(t_n)$ is set to 0 and the digital sample value $Q(t_n)$ is set to the range of V or less and more than 0, the instantaneous phase $\phi(t_n)$ is set to the range of 3π/2 or more and less than 2π, and the instantaneous phase can be determined from the following calculation:

$$\phi(t_n)=(3\pi/2)+(\pi/2)\cdot[V-Q(t_n)]/V.$$

On the other hand, the counter 17 counts (adds and counts) a clock signal c which is output as shown in (h) of FIG. 13 from the reference signal generator 11, and subsequently outputs its count value M as shown in (i) of FIG. 13.

The interval time calculation unit 18 receives the count value M output from the counter 17, the instantaneous phase $\phi(t_n)$ output from the instantaneous phase calculation unit 15, and the pulse signal p, and calculates an input interval time T of the pulse signal p.

For example, as shown in (d) of FIG. 13, in the case where an interval T of input timings t1 and t2 of the pulse signal p is determined, a difference Δφ (a radian) between instantaneous phases $\phi(t_1)$ and $\phi(t_2)$ obtained at the respective timings is determined from the following calculation:

$$\Delta\phi=\phi(t_2)-\phi(t_1).$$

In addition, a difference ΔM (a stepping number of the counter 17) between a count value M(t1) at t1 and a count value M(t2) at t2 is determined from the following calculation:

$$\Delta M=M(t2)-M(t1).$$

(In the example shown in (i) of FIG. 13, the following mathematical expression is established: ΔM=u+2−u=2).

Then, the interval T is calculated from the following calculation:

$$T=(1/fr)\cdot(\Delta M+\Delta\phi/2\pi).$$

A precision of the interval T calculated by the time interval measuring apparatus 10 having the configuration is determined with a precision of the phase difference Δφ while a precision of the phase difference Δφ depends on the bit numbers of the A/D converters 13 and 14.

For example, in the case where each of the A/D converters 13 and 14 is of a 14 bits type, voltages of the analog signals i(t) and q(t) ranging from 0 to the maximum voltage V are represented in values from all bits 0 to all bits 1, and a reference signal frequency fr is 10 MHz, a time required for the voltage of the trapezoid waveform to change from 0 to V becomes 25 nsec.

Consequently, the time resolution during the time becomes about 25/16000 (nsec)=25/16 (psec). In theory, the precision of several psec can be realized.

Incidentally, as described above, the following patent document 1 describes a technique in which a reference signal r(t) having an analog trapezoid-shaped wave is divided into the analog signals i(t) and q(t) having different phases through 90 degrees by a phase shifter 12, the analog signals i(t) and q(t) are input to the A/D converters 13 and 14, respectively to perform sampling of the analog signals i(t) and q(t) with a pulse signal p to be measured, thereby determining an input interval time of the pulse signal p to be measured based on the digital sample values $I(t_n)$ and $Q(t_n)$.

Patent Document 1: Jpn. Pat. Appln. KOKAI Publication No. 5-215873

However, the measurement precision of the several psec is a theoretical value. With an actual time interval measuring apparatus 10, it is extremely difficult to measure the input interval time of the pulse signal p to be measured accurately and stably with the precision depending on a diagonal error of the phase shifter 12, a characteristic difference and environmental change of the A/D converters 13 and 14.

That is, in the case of the 90 degrees hybrid type which is generally used as an analog phase shifter 12, a diagonal error (a phase error and an amplitude error) is present. Besides, the error largely changes with environmental changes such as the frequency and temperatures.

Therefore, even if a circuit constant in the phase shifter 12 is adjusted at a certain frequency and under a certain environment to obtain a desired precision, it is impossible to maintain the precision over a long time.

Further, since the reference signal r(t) having the trapezoid-shaped wave includes many high frequency components in addition to its fundamental wave components, it is demanded that the phase shifter 12 which performs a phase shift process without deforming such a reference signal r(t) having the trapezoid-shaped wave has a wideband characteristic which is several times wider than the frequency fr of the fundamental wave.

However, in actuality, it is substantially impossible to prevent a change of the error characteristic by the phase shifter 12 having such a wideband characteristic.

When an example of the numeric value is shown, a phase error of one degree in the phase shifter 12 at the frequency fr of the reference signal corresponds to a measurement error of 1/(fr·360) sec p-p, and a measurement error when the frequency fr is 10 MHz becomes 277 psec p-p.

On the other hand, in order to set the measurement error to 100 psec or less, it is required to set the phase error of the phase shifter 12 to 0.3 degree or less in a wide frequency band, which is impossible to realize.

Furthermore, the A/D converters 13 and 14 respectively have individual delay characteristics, gain characteristics, and direct current offset characteristics. Depending on differences in these characteristics, a phase error, an amplitude error and a direct current offset error may occur between the digital sample values I and Q.

Generally, a delay time of a sampling process of an A/D converter is several hundreds of psec on the shortest level. It is extremely difficult to allow a difference in delay time between two A/D converters 13 and 14 to a level on the order of 100 psec or less.

In addition, even if the difference in delay time is eliminated by a delay process with respect to a pulse signal p which is input to the side of one of the A/D converters, it is impossible to obtain a long time precision owing to the characteristic change resulting from the temperature of the delay process unit.

DISCLOSURE OF INVENTION

In order to solve the problem of the prior art as described above, an object of the present invention is to provide a time interval measuring apparatus which is capable of accurately and stably measuring an input interval time of a pulse signal with a high precision, and a jitter measuring apparatus using the time interval measuring apparatus.

According to a first aspect of the present invention, in order to achieve the above object, there is provided a time interval measuring apparatus comprising:

a reference signal generator (21) which generates a reference signal r(t) of a sine wave having a predetermined frequency;

a phase shifter (22) which receives the reference signal r(t) generated by the reference signal generator (21), and outputs a first analog signal i(t) and a second analog signal q(t) whose phases are shifted each other;

a first analog/digital (A/D) converter (23) which performs sampling of the first analog signal i(t) which is output from the phase shifter (22) at an input timing of a pulse signal (p) for time interval measurement, converts a value obtained by the sampling into a first digital sample value $I(t_n)$, and outputs the first digital sample value $I(t_n)$;

a second A/D converter (24) which performs sampling of the second analog signal q(t) which is output from the phase shifter (22) at the input timing of the pulse signal (p), converts a value obtained by the sampling into a second digital sample value $Q(t_n)$, and output the second digital sample value $Q(t_n)$;

an error correction unit (25) which receives the first digital sample value $I(t_n)$ and the second digital sample value $Q(t_n)$ which are output from the first A/D converter (23) and the second A/D converter (24), and respectively corrects direct current offset errors respectively generated in the first digital sample value $I(t_n)$ and the second digital sample value $Q(t_n)$, and a phase error with respect to 90 degrees and an amplitude error which are generated between the first digital sample value $I(t_n)$ and the second digital sample value $Q(t_n)$, the errors being generated by the phase shifter (22), the first A/D converter (23) and the second A/D converter (24);

an instantaneous phase calculation unit (32) which calculates an instantaneous phase $\phi(t_n)$ of the reference signal r(t) at the input timing of the pulse signal (p) based on the first digital sample value $I(t_n)'$ and the second digital sample value $Q(t_n)'$ in which the errors are already corrected by the error correction unit (25); and an interval time calculation unit (35) which determines a variation ($\Delta\phi$) of the instantaneous phases from each of the instantaneous phase $\phi(t_n)$ which is respectively calculated by the instantaneous phase calculation unit (32) at each of the input timing of two of the pulse signals (p), and determines an input interval time (T) of the pulse signals (p) based on the variation ($\Delta\phi$) of the instantaneous phases.

According to a second aspect of the present invention, in order to achieve the above object, there is provided the time interval measuring apparatus according to the first aspect, further comprising:

a frequency multiplier (33) which receives the reference signal r(t) generated by the reference signal generator (21), and generates a frequency multiplication signal m(t) which is obtained by multiplying the frequency of the reference signal r(t) by a multiplication number of 3 or more; and a counter (34) which counts the frequency multiplication signal m(t) output from the frequency multiplier (33), wherein the interval time calculation unit (35) obtains a count value $M(t_n)$ of the counter (34) at the input timing of the pulse signals (p), determines the variation ($\Delta M$) of count values from each of the count value at each of the input timing of two of the pulse signals (p), and determines an input interval time (T) of the pulse signals (p) based on the variation ($\Delta M$) of the count values and the variation ($\Delta\phi$) of the instantaneous phases.

According to a third aspect of the present invention, in order to achieve the above object, there is provided a time interval measuring apparatus comprising:

a reference signal generator (21) which generates a reference signal r(t) of a sine wave having a predetermined frequency;

a phase shifter (22) which receives the reference signal r(t) generated by the reference signal generator (21), and outputs a first analog signal i(t) and a second analog signal q(t) whose phases are shifted each other;

a first analog/digital (A/D) converter (23) which performs sampling of the first analog signal which is output from the phase shifter (22) at an input timing of a pulse signal (p1) for a start of time interval measurement, converts a value obtained by the sampling into a first digital sample value $I(t_n)$, and outputs the first digital sample value $I(t_n)$;

a second A/D converter (24) which performs sampling of the second analog signal which is output from the phase shifter (22) at the input timing of the pulse signal (p1) for the start of time interval measurement, converts a value obtained by the sampling into a second digital sample value $Q(t_n)$, and outputs the second digital sample value $Q(t_n)$;

a first error correction unit (25) which receives the first digital sample value $I(t_n)$ and the second digital sample value $Q(t_n)$ which are output from the first A/D converter (23) and the second A/D converter (24), and respectively corrects direct current offset errors respectively generated in the first digital sample value $I(t_n)$ and the second digital sample value $Q(t_n)$, and a phase error with respect to 90 degrees and an amplitude error generated between the first digital sample value $I(t_n)$ and the second digital sample value $Q(t_n)$, the errors being generated by the phase shifter (22), the first A/D converter (23) and the second A/D converter (24);

a first instantaneous phase calculation unit (32) which calculates a first instantaneous phase ($\phi 1$) of the reference signal r(t) at the input timing of the pulse signal (p1) for the start of time interval measurement based on the first digital sample value $I(t_n)'$ and the second digital sample value $Q(t_n)'$ in which the errors are already corrected by the first error correction unit (25);

a third A/D converter (233) which performs sampling of the first analog signal which is output from the phase shifter (22) at an input timing of a pulse signal (p2) for an end of time interval measurement, converts a value obtained by the sampling into a third digital sample value $I(t_n)$, and outputs the third digital sample value $I(t_n)$;

a fourth A/D converter (244) which performs sampling of the second analog signal which is output from the phase shifter (22) at the input timing of the pulse signal (p2) for the end of time interval measurement, converts a value obtained by the sampling into a fourth digital sample value $Q(t_n)$, and outputs the fourth digital sample value $Q(t_n)$;

a second error correction unit (255) which receives the third digital sample value $I(t_n)$ and the fourth digital sample value $Q(t_n)$ which are output from the third A/D converter (233) and the fourth A/D converter (244), and respectively corrects direct current offset errors respectively generated in the third digital sample value $I(t_n)$ and the fourth digital sample value $Q(t_n)$, and a phase error with respect to 90 degrees and an amplitude error which are generated between the third digital sample value $I(t_n)$ and the fourth digital sample value $Q(t_n)$, the errors being generated by the phase shifter (22), the third A/D converter (233) and the fourth A/D converter (244);

a second instantaneous phase calculation unit (322) which calculates a second instantaneous phase ($\phi 2$) of the reference signal r(t) at the input timing of the pulse signal (p2) for the end of time interval measurement based on the third digital sample value $I(t_n)'$ and the fourth digital sample value $Q(t_n)'$ in which the errors are already corrected by the second error correction unit (255); and an interval time calculation unit (35) which determines as a variation ($\Delta\phi$) of instantaneous phases a difference between the first instantaneous phase (φ1) and the second instantaneous phase (φ2) which are respectively calculated by the first instantaneous phase calculation unit (32) and the second instantaneous phase calculation unit (322), and determines an input interval time (T) of the pulse signal (p1) for the start of time interval measurement and the pulse signal (p2) for the end of time interval measurement based on the variation (Δφ) of the instantaneous phases.

According to a fourth aspect of the present invention, in order to achieve the above object, there is provided the time interval measuring apparatus according to the third aspect, further comprising:

a frequency multiplier (33) which receives a reference signal r(t) generated by the reference signal generator (21), and generates a frequency multiplication signal m(t) which is obtained by multiplying the frequency of the reference signal r(t) by a multiplication number of 3 or more; and a counter (34) which counts the frequency multiplication signal m(t) output from the frequency multiplier (33), wherein the interval time calculation unit (35) obtains a first count value (M1) from the counter (34) at the input timing of the pulse signal (p1) for the start of time interval measurement and a second count value (M2) from the counter (34) at the input timing of the pulse signal (p2) for the end of time interval measurement, determines a difference between the first count value (M1) and the second count value (M2) as a variation (ΔM) of the count values, and determines an input interval time (T) of the pulse signal (p1) for the start of time interval measurement and the pulse signal (p2) for the end of time interval measurement based on the variation (ΔM) of the count values and the variation (Δφ) of the instantaneous phases.

According to a fifth aspect of the present invention, in order to achieve the above object, there is provided the time interval measuring apparatus according to the first or second aspect, wherein the error correction unit (25) comprises:

an offset correction unit (26) which corrects the direct current offset errors respectively generated in the first digital sample value I($t_n$) and the second digital sample value Q($t_n$) which are output from the first A/D converter (23) and the second A/D converter (24);

a phase correction unit (27) which corrects the phase error with respect to 90 degrees generated between the first digital sample value Ia($t_n$) in which the direct current offset error is already corrected by the offset correction unit (26) and the second digital sample value Qa($t_n$) in which the direct current offset error is already corrected by the offset correction unit (26); and an amplitude correction unit (28) which corrects the amplitude error generated between the first digital sample value Ib($t_n$) in which the phase error with respect to the 90 degrees is already corrected by the phase correction unit (27) and the second digital sample value Qb($t_n$) in which the phase error with respect to the 90 degrees is already corrected by the phase correction unit (27).

According to a sixth aspect of the present invention, in order to achieve the above object, there is provided the time interval measuring apparatus according to the third or fourth aspect, wherein the first and second error correction units (25, 255) each comprise:

an offset correction unit (26) which corrects the direct current offset errors respectively generated in the first digital sample value I($t_n$) and the second digital sample value Q($t_n$) which are output from the first A/D converter (23) and the second A/D converter (24) or from the third A/D converter (233) and the fourth A/D converter (244);

a phase correction unit (27) which corrects the phase error with respect to 90 degrees generated between the first digital sample value Ia($t_n$) in which the direct current offset error is already corrected by the offset correction unit (26) and the second digital sample value Qa($t_n$) in which the direct current offset error is already corrected by the offset correction unit (26) or between the third digital sample value Ia($t_n$) in which the direct current offset error is already corrected by the offset correction unit (26) and the fourth digital sample value Qa($t_n$) in which the direct current offset error is already corrected by the offset correction unit (26); and an amplitude correction unit (28) which corrects the amplitude error generated between the first digital sample value Ib($t_n$) in which the phase error with respect to the 90 degrees is already corrected by the phase correction unit (27) and the second digital sample value Qb($t_n$) in which the phase error with respect to the 90 degrees is already corrected by the phase correction unit (27) or between the third digital sample value Ib($t_n$) in which the phase error with respect to the 90 degrees is already corrected by the phase correction unit (27) and the fourth digital sample value Qb($t_n$) in which the phase error with respect to the 90 degrees is already corrected by the phase correction unit (27).

According to a seventh aspect of the present invention, in order to achieve the above object, there is provided the time interval measuring apparatus according to the fifth or sixth aspect, wherein the offset correction unit (26) comprises:

first and second subtractors (26a, 26b) which respectively receive at each one end thereof the first digital sample value I($t_n$) and the second digital sample value Q($t_n$) or the third digital sample value I($t_n$) and the fourth digital sample value Q($t_n$) which are output from the first A/D converter (23) and the second A/D converter (24) or from the third A/D converter (233) and the fourth A/D converter (244); and first and second calculators (26c, 26d) which respectively calculate correction values (Hi, Hq) for correcting each of the direct current offset errors by calculation of average values with respect to output values Ia($t_n$), Qa($t_n$) from the first and second subtractors (26a, 26b), and supply the correction values to each another end of the first and second subtractors (26a, 26b).

According to an eighth aspect of the present invention, in order to achieve the above object, there is provided the time interval measuring apparatus according to the seventh aspect, wherein the phase correction unit (27) comprises:

a subtractor (27a) which receives at one end thereof the first digital sample value Ia($t_n$) in which the direct current offset error is already corrected by the offset correction unit (26) or the second digital sample value Qa($t_n$) in which the direct current offset error is already corrected by the offset correction unit (26) or the third digital sample value Ia($t_n$) in which the direct current offset error is already corrected by the offset correction unit (26) or the fourth digital sample value Qa($t_n$) in which the direct current offset error is already corrected by the offset correction unit (26);

a first multiplier (27b) which determines a product of an output value Ib($t_n$) corresponding to the first digital sample value in which the direct current offset error is already corrected output from the subtractor (27a) or an output value Ib($t_n$) corresponding to the third digital sample value in which the direct current offset error is already corrected or an output value Qb($t_n$) corresponding to the second digital sample value in which the direct current offset error is already corrected or an output value Qb($t_n$) corresponding to the fourth digital sample value in which the direct current offset error is already corrected, and the second digital sample value Qa($t_n$) in which the direct current offset error is already corrected or the fourth digital sample value in which the direct current offset error is already corrected or the first digital sample value Ia($t_n$) in which the direct current offset error is already corrected or the third digital sample value Ia($t_n$) in which the direct current offset error is already corrected;

a calculator (27c) which determines a first correction coefficient P for taking to zero an average value of the product which is output from the multiplier (27b); and a second multiplier (27d) which determines a product of the first correction coefficient P determined by the calculator (27c) and the second digital sample value Qa($t_n$) in which the direct current offset error is already corrected or the fourth digital sample value in which the direct current offset error is already corrected or the first digital sample value Ia($t_n$) in which the direct current offset error is already corrected or the third digital sample value Ia($t_n$) in which the direct current offset error is already corrected, and outputs the product to another end of the subtractor (27a)

According to a ninth aspect of the present invention, in order to achieve the above object, there is provided the time interval measuring apparatus according to the eighth aspect, wherein the amplitude correction unit (28) comprises:

a first subtractor (28a) which receives at one end thereof a first digital sample value Ib($t_n$) in which the phase error corrected with respect to the 90 degrees is already corrected by the phase correction unit (27) or the third digital sample value Ib($t_n$) in which the phase error corrected with respect to the 90 degrees is already corrected by the phase correction unit (27) or the second digital sample value Qb($t_n$) in which the phase error corrected with respect to the 90 degrees is already corrected by the phase correction unit (27) or the fourth digital sample value Qb($t_n$) in which the phase error corrected with respect to the 90 degrees is already corrected by the phase correction unit (27);

a first multiplier (28b) which calculates a square of the first digital sample value Ib($t_n$) in which the phase error with respect to the 90 degrees is already corrected by the phase correction unit (27) or the third digital sample value Ib($t_n$) in which the phase error with respect to the 90 degrees is already corrected by the phase correction unit (27) or the second digital sample value Qb($t_n$) in which the phase error with respect to the 90 degrees is already corrected by the phase correction unit (27) or the fourth digital sample value Qb($t_n$) in which the phase error with respect to the 90 degrees is already corrected by the phase correction unit (27);

a second multiplier (28c) which calculates a square of an output value Ic($t_n$) corresponding to the first digital sample value Ib($t_n$) in which the phase error with respect to the 90 degrees from the first subtractor (28a) is already corrected by the phase correction unit (27) or an output value Qc($t_n$) corresponding to the third digital sample value Qb($t_n$) in which the phase error with respect to the 90 degrees from the first subtractor (28a) is already corrected by the phase correction unit (27) or an output value Qc($t_n$) corresponding to the second digital sample value Qb($t_n$) in which the phase error with respect to the 90 degrees is already corrected by the phase correction unit (27) or an output value Qc($t_n$) corresponding to the fourth digital sample value Qb($t_n$) in which the phase error with respect to the 90 degrees is already corrected by the phase correction unit (27);

a second subtractor (28d) which determines a difference between outputs from the first and second multipliers (28b, 28c);

a calculator (28e) which calculates a second correction coefficient G for taking to zero an average value of an output from the second subtractor (28d); and a third multiplier (28f) which determines a product of the second correction coefficient G determined by the calculator (28e) and the first digital sample value Ib($t_n$) in which the phase error with respect to the 90 degrees is already corrected by the phase correction unit (27) or the third digital sample value Ib($t_n$) in which the phase error with respect to the 90 degrees is already corrected by the phase correction unit (27), or the second digital sample value Qb($t_n$) in which the phase error with respect to the 90 degrees is already corrected by the phase correction unit (27) or the fourth digital sample value Qb($t_n$) in which the phase error with respect to the 90 degrees is already corrected by the phase correction unit (27) and outputs the product to another end of the first subtractor (28a).

According to a tenth aspect of the present invention, in order to achieve the above object, there is provided a jitter measuring apparatus comprising:

a time interval measuring apparatus (20); and a jitter calculation unit (41), wherein the time interval measuring apparatus (20) comprises:

a reference signal generator (21) which generates a reference signal r(t) of a sine wave having a predetermined frequency;

a phase shifter (22) which receives the reference signal r(t) generated by the reference signal generator (21), and outputs a first analog signal i(t) and a second analog signal q(t) whose phases are shifted each other;

a first analog/digital (A/D) converter (23) which performs sampling of the first analog signal i(t) which is output from the phase shifter (22) at an input timing of a pulse signal (p) for time interval measurement, converts a value obtained by the sampling into a first digital sample value I($t_n$), and outputs the first digital sample value I($t_n$);

a second A/D converter (24) which performs sampling of the second analog signal q(t) which is output from the phase shifter (22) at the input timing of the pulse signal (p), converts a value obtained by the sampling into a second digital sample value Q($t_n$), and outputs the second digital sample value Q($t_n$);

an error correction unit (25) which receives the first digital sample value I($t_n$) and the second digital sample value Q($t_n$) which are output from the first A/D converter (23) and the second A/D converter (24), and respectively corrects direct current offset errors respectively generated in the first digital sample value I($t_n$) and the second digital sample value Q($t_n$), and a phase error with respect to 90 degrees and an amplitude error which are generated between the first digital sample value I($t_n$) and the second digital sample value Q($t_n$), the errors being generated by the phase shifter (22), the first A/D converter (23) and the second A/D converter (24);

an instantaneous phase calculation unit (32) which calculates an instantaneous phase $\phi(t_n)$ of the reference signal r(t) at the input timing of the pulse signal (p) based on the first digital sample value I($t_n$)' and the second digital sample value Q($t_n$)' in which the errors are already corrected by the error correction unit (25); and an interval time calculation unit (35) which determines a variation ($\Delta\phi$) of the instantaneous phases from each of the instantaneous phase $\phi(t_n)$ respectively calculated by the instantaneous phase calculation unit (32) at each of the input timing of two of the pulse signals (p), and determines an input interval time (T) of the pulse signals (p) based on the variation ($\Delta\phi$) of the instantaneous phases, and the jitter calculation unit (41) calculates a jitter amount by using the input interval time (T) of the pulse signal (p) measured by the time interval measuring apparatus (20).

According to an eleventh aspect of the present invention, in order to achieve the above object, there is provided the jitter measuring apparatus according to the tenth aspect, wherein the time interval measuring apparatus (20) further comprises:

a frequency multiplier (33) which receives the reference signal r(t) generated by the reference signal generator (21), and generates a frequency multiplication signal m(t) which is obtained by multiplying the frequency of the reference signal r(t) by a multiplication number of 3 or more; and a counter (34) which counts the frequency multiplication signal m(t) output from the frequency multiplier (33), wherein the interval time calculation unit (35) obtains a count value $M(t_n)$ of the counter (34) at the input timing of the pulse signal (p), determines a variation ($\Delta M$) of count values from each of the count value at each of the input timing of two of the pulse signals (p), and determines the input interval time (T) of the pulse signals (p) based on the variation ($\Delta M$) of the count values and the variation ($\Delta\phi$) of the instantaneous phases.

According to a twelfth aspect of the present invention, in order to achieve the above object, there is provided a jitter measuring apparatus (40) comprising:

a time interval measuring apparatus (20); and a jitter calculation unit (41), wherein the time interval measuring apparatus (20) comprises:

a reference signal generator (21) which generates a reference signal r(t) of a sine wave having a predetermined frequency;

a phase shifter (22) which receives the reference signal r(t) generated by the reference signal generator (21), and outputs a first analog signal i(t) and a second analog signal q(t) whose phases are shifted each other;

a first analog/digital (A/D) converter (23) which performs sampling of the first analog signal i(t) which is output from the phase shifter (22) at an input timing of a pulse signal (p1) for a start of time interval measurement, converts a value obtained by the sampling into a first digital sample value $I(t_n)$, and outputs the first digital sample value $I(t_n)$;

a second A/D converter (24) which performs sampling of the second analog signal which is output from the phase shifter (22) at the input timing of the pulse signal (p1) for the start of time interval measurement, converts an value obtained by the sampling into a second digital sample value $Q(t_n)$, and outputs the second digital sample value $Q(t_n)$;

a first error correction unit (25) which receives the first digital sample value $I(t_n)$ and the second digital sample value $Q(t_n)$ which are output from the first A/D converter (23) and the second A/D converter (24), and respectively corrects direct current offset errors respectively generated in the first digital sample value $I(t_n)$ and the second digital sample value $Q(t_n)$, and a phase error with respect to 90 degrees and an amplitude error which are generated between the first digital sample value $I(t_n)$ and the second digital sample value $Q(t_n)$, the errors being generated by the phase shifter (22), the first A/D converter (23) and the second A/D converter (24);

a first instantaneous phase calculation unit (32) which calculates a first instantaneous phase ($\phi 1$) of the reference signal r(t) at the input timing of the pulse signal (p1) for the start of time interval measurement based on the first digital sample value $I(t_n)'$ and the second digital sample value $Q(t_n)'$ in which the errors are already corrected by the first error correction unit (25);

a third A/D converter (233) which performs sampling of the first analog signal i(t) which is output from the phase shifter (22) at an input timing of a pulse signal (p2) for an end of time interval measurement, converts a value obtained by the sampling into a third digital sample value $I(t_n)$, and outputs the third digital sample value $I(t_n)$;

a fourth A/D converter which performs sampling of the second analog signal q(t) which is output from the phase shifter (22) at the input timing of the pulse signal (p2) for the end of time interval measurement, converts an value obtained by the sampling into a fourth digital sample value $Q(t_n)$ of digital and outputs the fourth digital sample value $Q(t_n)$;

a second error correction unit (255) which receives the third digital sample value $I(t_n)$ and the fourth digital sample value $Q(t_n)$ which are output from the third A/D converter (233) and the fourth A/D converter (244), and respectively corrects direct current offset errors respectively generated in the third digital sample value $I(t_n)$ and the fourth digital sample value $Q(t_n)$, and a phase error with respect to 90 degrees and a amplitude error which are generated between the third digital sample value $I(t_n)$ and the fourth digital sample value $Q(t_n)$, the errors being generated by the phase shifter (22), the third A/D converter (233) and the fourth A/D converter (244);

a second instantaneous phase calculation unit (322) which calculates a second instantaneous phase ($\phi 2$) of the reference signal r(t) at the input timing of the pulse signal (p2) for the end of time interval measurement based on the third digital sample value $I(t_n)'$ and the fourth digital sample value $Q(t_n)'$ in which the errors are already corrected by the second error correction unit (255); and an interval time calculation unit (35) which determines as a variation ($\Delta\phi$) of instantaneous phases a difference between the first instantaneous phase ($\phi 1$) and the second instantaneous phase ($\phi 2$) respectively calculated by the first instantaneous phase calculation unit (32) and the second instantaneous phase calculation unit (322), and determines an input interval time (T) of the pulse signal (p1) for the start of time interval measurement and the pulse signal (p2) for the end of time interval measurement based on the variation ($\Delta\phi$) of the instantaneous phases, and the jitter calculation unit (41) calculates a jitter amount by using the input interval time (T) of the pulse signal (p1) for the start of time interval measurement and the pulse signal (p2) for the end of time interval measurement measured by the time interval measuring apparatus (20).

According to a thirteenth aspect of the present invention, in order to achieve the above object, there is provided the jitter measuring apparatus according to the twelfth aspect, wherein the time interval measuring apparatus (20) further comprises:

a frequency multiplier (33) which receives the reference signal r(t) generated by the reference signal generator (21), and generates a frequency multiplication signal m(t) which is obtained by multiplying the frequency of the reference signal r(t) by a multiplication number of 3 or more; and a counter (34) which counts the frequency multiplication signal m(t) output from the frequency multiplier (33), wherein the interval time calculation unit (35) obtains a first count value (M1) from the counter (34) at the input timing of the pulse signal (p1) for the start of time interval measurement and a second count value (M2) from the counter (34) at the input timing of the pulse signal (p2) for the end of time interval measurement, determines a difference between the first count value (M1) and the second count value (M2) as a variation ($\Delta M$) of the count values, and determines an input interval time (T) of the pulse signal (p1) for the start of time interval measurement and the pulse signal (p2) for the end of time interval measurement based on the variation ($\Delta M$) of the count values and the variation ($\Delta\phi$) of the instantaneous phases.

According to a fourteenth aspect of the present invention, in order to achieve the above object, there is provided the jitter measuring apparatus according to the tenth or eleventh aspect, wherein the error correction unit (25) of the time interval measuring apparatus (20) comprises:

an offset correction unit (26) which corrects the direct current offset errors respectively generated in the first digital sample value $I(t_n)$ and the second digital sample value $Q(t_n)$ which are output from the first A/D converter (23) and the second A/D converter (24);

a phase correction unit (27) which corrects a phase error with respect to 90 degrees generated between the first digital sample value $Ia(t_n)$ in which the direct current offset error is already corrected by the offset correction unit (26) and the second digital sample value $Qa(t_n)$ in which the direct current offset error is already corrected by the offset correction unit (26); and an amplitude correction unit (28) which corrects an amplitude error generated between the first digital sample value $Ib(t_n)$ in which the phase error with respect to the 90 degrees is already corrected by the phase correction unit (27) and the second digital sample value $Qb(t_n)$ in which the phase error with respect to the 90 degrees is already corrected by the phase correction unit (27).

According to a fifteenth aspect of the present invention, in order to achieve the above object, there is provided the jitter measuring apparatus according to the twelfth or thirteenth aspect, wherein the first and second error correction units (25, 255) of the time interval measuring apparatus (20) each comprise:

an offset correction unit (26) which corrects the direct current offset errors respectively generated in the first digital sample value $I(t_n)$ and the second digital sample value $Q(t_n)$ or the third digital sample value $I(t_n)$ and the fourth digital sample value $Q(t_n)$ which are output from the first A/D converter (23) and the second A/D converter (24) or from the third A/D converter (233) and the fourth A/D converter (244);

a phase correction unit (27) which corrects the phase error with respect to 90 degrees generated between a first digital sample value $Ia(t_n)$ in which the direct current offset error is already corrected by the offset correction unit (26) or a third digital sample value $Ia(t_n)$ in which the direct current offset error is already corrected by the offset correction unit (26) and a second digital sample value $Qa(t_n)$ in which the direct current offset error is already corrected by the offset correction unit (26) or a fourth digital sample value $Qa(t_n)$ in which the direct current offset error is already corrected by the offset correction unit (26); and an amplitude correction unit (28) which corrects the amplitude error generated between a first digital sample value $Ib(t_n)$ in which the phase error with respect to the 90 degrees is already corrected by the phase correction unit (27) or a third digital sample value $Ib(t_n)$ in which the phase error with respect to the 90 degrees is already corrected by the phase correction unit (27) and a second digital sample value $Qb(t_n)$ in which the phase error with respect to the 90 degrees is already corrected by the phase correction unit (27) or a fourth digital sample value $Qb(t_n)$ in which the phase error with respect to the 90 degrees is already corrected by the phase correction unit (27).

According to a sixteenth aspect of the present invention, in order to achieve the above object, there is provided the jitter measuring apparatus according to the fourteenth or fifteenth aspect, wherein the offset correction unit (26) comprises:

first and second subtractors (26a, 26b) which respectively receive at each one end thereof the first digital sample value $I(t_n)$ and the second digital sample value $Q(t_n)$ or the third digital sample value $I(t_n)$ and the fourth digital sample value $Q(t_n)$ which are output from the first A/D converter (23) and the second A/D converter (24) or from the third A/D converter (233) and the fourth A/D converter (244); and first and second calculators (26c, 26d) which respectively calculate correction values (Hi, Hq) for correcting the direct current offset errors by calculation of average values with respect to output values $Ia(t_n)$, $Qa(t_n)$ from the first and second subtractors (26a, 26b), and supply the correction values to each another end of the first and second subtractors (26a, 26b).

According to a seventeenth aspect of the present invention, in order to achieve the above object, there is provided the jitter measuring apparatus according to the sixteenth aspect, wherein the phase correction unit (27) comprises:

a subtractor (27a) which receives at one end thereof a first digital sample value $Ia(t_n)$ in which the direct current offset error is already corrected by the offset correction unit (26) or a second digital sample value $Qa(t_n)$ in which the direct current offset error is already corrected by the offset correction unit (26) or a third digital sample value $Ia(t_n)$ in which the direct current offset error is already corrected by the offset correction unit (26) or a fourth digital sample value $Qa(t_n)$ in which the direct current offset error is already corrected by the offset correction unit (26);

a first multiplier (27b) which determines a product of an output value $Ib(t_n)$ corresponding to a first digital sample value in which the direct current offset error is already corrected or an output value $Ib(t_n)$ corresponding to a third digital sample value in which the direct current offset error is already corrected or an output value $Qb(t_n)$ corresponding to a second digital sample value in which the direct current offset error is already corrected or an output value $Qb(t_n)$ corresponding to a fourth digital sample value in which the direct current offset error is already corrected output from the subtractor (27a), and a second digital sample value $Qa(t_n)$ in which the direct current offset error is already corrected or a fourth digital sample value in which the direct current offset error is already corrected or a first digital sample value $Ia(t_n)$ in which the direct current offset error is already corrected or a third digital sample value $Ia(t_n)$ in which the direct current offset error is already corrected;

a calculator (27c) which determines a first correction coefficient P for taking to zero an average value of the product which is output from the first multiplier (27b); and a second multiplier (27d) which determines a product of the first correction coefficient P determined by the calculator (27c) and a second digital sample value $Qa(t_n)$ in which the direct current offset error is already corrected or a fourth digital sample value in which the direct current offset error is already corrected or a first digital sample value $Ia(t_n)$ in which the direct current offset error is already corrected or a third digital sample value $Ia(t_n)$ in which the direct current offset error is already corrected, and outputs the product to another end of the subtractor (27a)

According to an eighteenth aspect of the present invention, in order to achieve the above object, there is provided the jitter measuring apparatus according to the seventeenth aspect, wherein the amplitude correction unit (28) comprises:

a first subtractor (28a) which receives at one end thereof a first digital sample value $Ib(t_n)$ in which the phase error corrected with respect to the 90 degrees is already corrected by the phase correction unit (27) or a third digital sample value $Ib(t_n)$ in which the phase error corrected with respect to the 90 degrees is already corrected by the phase correction unit (27) or a second digital sample value $Qb(t_n)$ in which the phase error corrected with respect to the 90 degrees is already corrected by the phase correction unit (27) or a fourth digital sample value $Qb(t_n)$ in which the phase error corrected with respect to the 90 degrees is already corrected by the phase correction unit (27);

a first multiplier (28b) which calculates a square of a first digital sample value $Ib(t_n)$ in which the phase error with respect to the 90 degrees is already corrected by the phase correction unit (27) or a third digital sample value $Ib(t_n)$ in which the phase error with respect to the 90 degrees is already corrected by the phase correction unit (27) or a second digital sample value $Qb(t_n)$ in which the phase error with respect to the 90 degrees is already corrected by the phase correction unit (27) or a fourth digital sample value $Qb(t_n)$ in which the phase error with respect to the 90 degrees is already corrected by the phase correction unit (27);

a second multiplier (28c) which calculates a square of an output value $Ic(t_n)$ corresponding to a first digital sample value $Ib(t_n)$ in which the phase error with respect to the 90 degrees is already corrected from the first subtractor (28a) or an output value $Qc(t_n)$ corresponding to a third digital sample value $Qb(t_n)$ in which the phase error with respect to the 90 degrees is already corrected from the first subtractor (28a) or an output value $Qb(t_n)$ corresponding to a second digital sample value in which the phase error with respect to the 90 degrees is already corrected or an output value $Qb(t_n)$ corresponding to a fourth digital sample value in which the phase error with respect to the 90 degrees is already corrected;

a second subtractor (28d) which determines a difference between outputs from the first and second multipliers (28b, 28c);

a calculator (28e) which calculates a second correction coefficient G for taking to zero an average value of an output from the second subtractor (28d); and a third multiplier (28f) which determines a product of the second correction coefficient G determined by the calculator (28e) and a first digital sample value $Ib(t_n)$ in which the phase error with respect to the 90 degrees is already corrected or a third digital sample value $Ib(t_n)$ in which the phase error with respect to the 90 degrees is already corrected, or a second digital sample value $Qb(t_n)$ in which the phase error with respect to the 90 degrees is already corrected by the phase correction unit (27) or a fourth digital sample value $Qb(t_n)$ in which the phase error with respect to the 90 degrees is already corrected by the phase correction unit (27) and outputs the product to another end of the first subtractor (28a).

As has been described above, in the time interval measuring apparatus according to the first aspect of the present invention, the error correction unit respectively corrects a phase error, an amplitude error and a direct current offset error between two signals which are generated in the phase shifter, the first and second A/D converters to determine an instantaneous phase and to determine an input interval time of the pulse signal based on the instantaneous phase.

That is, the time interval measuring apparatus according to the first aspect of the present invention, in a prior art disclosed in the patent document 1 or the like, not only eliminates the need of the adjustment work of a circuit constant inside of the phase shifter which is required for setting the phase difference between the two signals output from the phase shifter to 90 degrees, but also is capable of correcting the phase error and the amplitude error generated in the phase shifter by means of the numeric value calculation with a combination of three kinds of errors such as the direct current offset errors, the phase error and the amplitude error which are generated in the first and second A/D converters at the rear stage of the phase shifter.

As a consequence, in accordance with the time interval measuring apparatus (20) according to the first aspect, it is possible to easily realize a time interval measuring apparatus having a precision of several hundreds of psec or less which cannot be realized in the prior art.

In accordance with the time interval measuring apparatus (20) according to the second aspect of the invention, a frequency multiplication signal which is obtained by multiplying the frequency of the reference signal with a multiplication number of 3 or more is counted by a counter, and an input interval time of a pulse signal is calculated based on a variation of the count values and a variation of the instantaneous phases. Consequently, it is possible to measure with no errors a time interval which exceeds a period of a reference signal free from an influence of a jitter of a multiplication signal of a frequency of the count value.

Further, in accordance with the time interval measuring apparatus (20) according to the third aspect of the present invention, two sets of apparatus are provided such as a set of the first and A/D converters, a set of the third and fourth second A/D converters, another set of the first and second error correction units, a set of the first and second instantaneous phase calculation units, so that one set of the first and second A/D converters receive a pulse signal indicative of a start of time measurement, and another set of the third and fourth A/D converters receive a pulse signal indicative of an end of time measurement. As a consequence, a lower limit of the measurement time is eliminated, and the input interval time of the pulse signals can be measured from 0.

Furthermore, in accordance with a jitter measuring apparatus (40) according to the twelfth aspect of the present invention, a jitter amount is calculated based on the input interval time T measured with a high precision by the time interval measuring apparatus (20) according to the first aspect of the invention or by the time interval measuring apparatus (20') according to the third aspect of the invention. As a consequence, the precision of the jitter amount is sufficiently high, and highly precise jitter measurement can be performed.

BRIEF DESCRIPTION OF DRAWINGS

FIG. 2 is a block diagram showing a configuration of an offset correction unit 26 in an error correction unit 25 as a configuration example of an essential portion of FIG. 1;

FIG. 3 is a block diagram showing a configuration of a phase correction unit 27 in the error correction unit 25 as a configuration example of an essential portion of FIG. 1;

BEST MODE FOR CARRYING OUT THE INVENTION

Hereinafter, embodiments of the present invention will be explained with reference to the drawings.

First Embodiment

Figure 1:
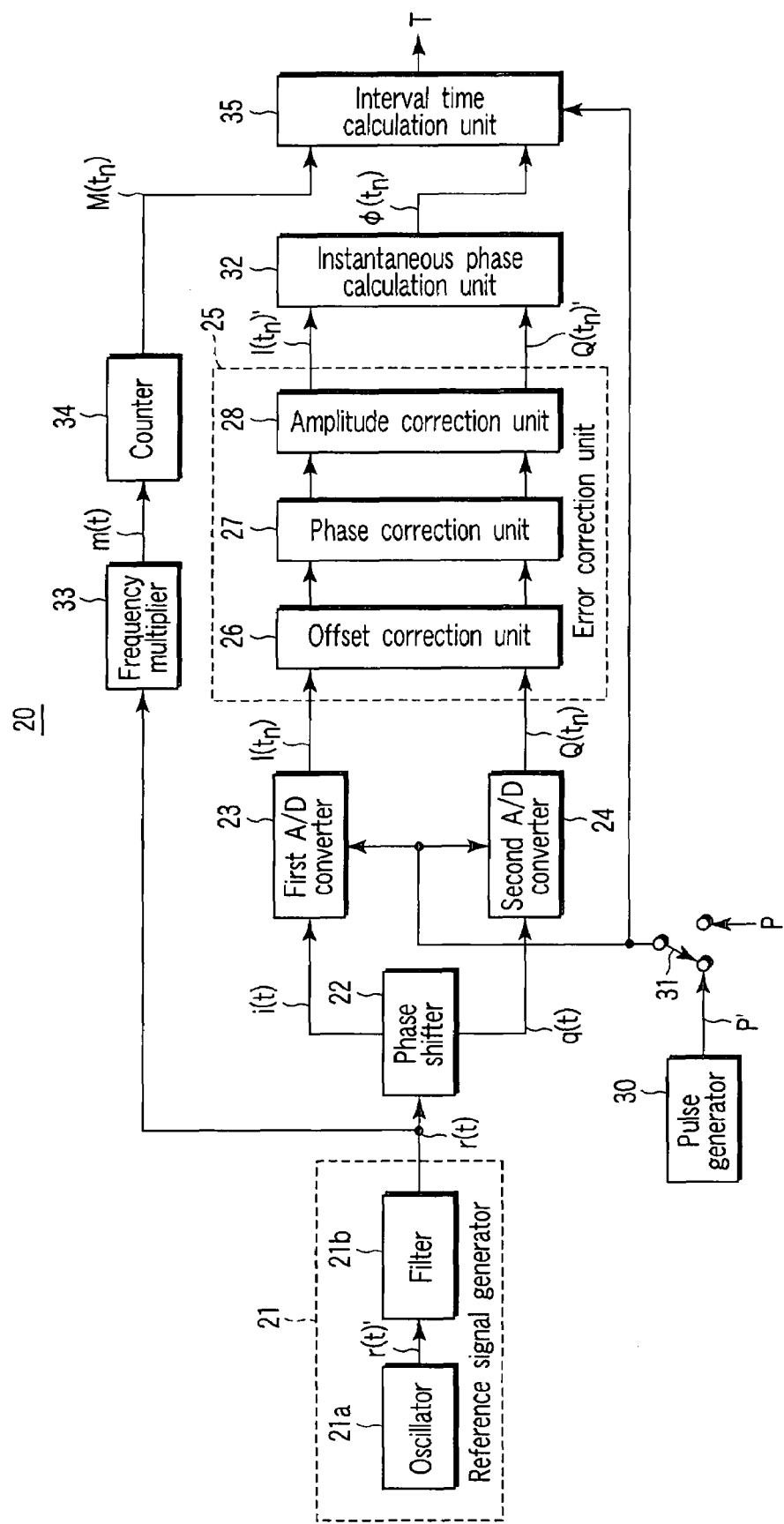
FIG. 1 is a block diagram showing a configuration of a time interval measuring apparatus 20 according to a first embodiment of the present invention.

FIG. 1 is a block diagram showing a configuration of a time interval measuring apparatus 20 according to a first embodiment of the present invention.

That is, the time interval measuring apparatus according to the first embodiment of the present invention basically comprises a reference signal generator 21, a phase shifter 22, a first analog/digital (A/D) converter 23, a second A/D converter 24, an error correction unit 25, an instantaneous phase calculation unit 32, and an interval time calculation unit 35. The reference signal generator 21 generates a reference signal r(t) having a sine wave with a predetermined frequency. The phase shifter 22 receives the reference signal r(t) generated by the reference signal generator 21, and outputs a first analog signal i(t) and a second analog signal q(t) whose phases are shifted each other. The first A/D converter 23 performs sampling of the first analog signal i(t) which is output from the phase shifter at an input timing of a pulse signal p for time interval measurement, converts a value obtained by the sampling into a first digital sample value $I(t_n)$, and outputs the first digital sample value $I(t_n)$. The second A/D converter 24 performs sampling of the second analog signal q(t) which is output from the phase shifter 22 at the input timing of the pulse signal p, converts a value obtained by the sampling into a second digital sample value $Q(t_n)$, and outputs the second digital sample value $Q(t_n)$. The error correction unit 25 receives the first digital sample value $I(t_n)$ and the second digital sample value $Q(t_n)$ which are output from the first A/D converter 23 and the second A/D converter, and respectively corrects direct current offset errors respectively generated in the first digital sample value $I(t_n)$ and the second digital sample value $Q(t_n)$, and a phase error with respect to 90 degrees and an amplitude error which are generated between the first digital sample value $I(t_n)$ and the second digital sample value $Q(t_n)$, the errors being generated by the phase shifter 22, the first A/D converter 23 and the second A/D converter 24. The instantaneous phase calculation unit 32 calculates an instantaneous phase $\phi(t_n)$ of the reference signal r(t) at the input timing of the pulse signal p based on the first digital sample value $I(t_n)'$ and the second digital sample value $Q(t_n)'$ corrected by the error correction unit 25. The interval time calculation unit 35 determines a variation ($\Delta\phi$) of the instantaneous phases $\phi(t_1)$ and $\phi(t_2)$ at two different input timings of the pulse signals p, and determines an input interval (T) of the pulse signals (p) based on the variation ($\Delta\phi$) of the instantaneous phases.

Specifically, as shown in FIG. 1, the reference signal generator 21 comprises an oscillator 21a and a narrow band filter 21b in order to generate a reference signal r(t) having a predetermined frequency fr. The oscillator 21a oscillates and outputs a signal r(t)' with an arbitrary waveform (for example, a sine wave, a rectangular wave and the like) having a stable frequency fr. The narrow band filter 21b extracts only a fundamental wave component having a frequency fr from an output signal r(t)' of the oscillator 21a and outputs a reference signal r(t) having the frequency fr and an accurate sine wave without deformation.

The phase shifter 22 for dividing the reference signal r(t) output from the reference signal generator 21 into two analog signals is constituted in such a manner that the first analog signal i(t1) and the second analog signal q(t2) having the same amplitude and having phases shifted to each other are output in a wave form (a sine wave) identical with the reference signal r.

Here, an angle β is a mere specification value of the phase shifter 22. It is not required that the phase difference between the two analog signals i(t) and q(t) which are actually output to the reference signal r(t) is not strictly identical to β, and the angle β is not required to be 90 degrees at all.

However, for the sake of the correction process of the error correction unit 25 which will be described later, the phase difference between the two analog signals i(t) and q(t) is required to be set to the range excluding 0 degree (the same phase), 180 degrees (a reverse phase) and in the vicinity thereof.

As described above, not only the phase error with respect to the angle β but also an amplitude error are present in the phase shifter 22, and therefore, the amplitudes of the two analog signals i(t) and q(t) are not strictly identical to each other.

Incidentally, in this case, since an object of the phase shift is a sine wave having a fixed frequency, a wideband characteristic is not demanded as the phase shifter 22.

The first analog signal i(t) of the two analog signals i(t) and q(t) which are output from the phase shifter 22 is input to the first A/D converter 23 while the second analog signal q(t) is input to the second A/D converter 24.

The first A/D converter 23 performs sampling of the first analog signal i(t) at an input timing $t_n$ of a pulse signal p to be measured, converts an analog sample value $i(t_n)$ obtained by the sampling into a first digital sample value $I(t_n)$, and outputs the first digital sample value $I(t_n)$.

In the same manner, the second A/D converter 24 performs sampling of the second analog signal q(t) at the input timing $t_n$ of the pulse signal p to be measured, converts an analog sample value $q(t_n)$ obtained by the sampling into a second digital sample value $Q(t_n)$, and outputs the second digital sample value $Q(t_n)$.

However, as described above, the first and second A/D converters 23 and 24 respectively have individual sampling delay characteristics, gain characteristics and direct current offsets. As a result a gain difference, a direct current offset error and a phase difference occur between the first digital sample value $I(t_n)$ and the second digital sample value $Q(t_n)$ which are output from the first and second A/D converters 23 and 24 depending on the differences in these characteristics.

As a consequence, the first digital sample value $I(t_n)$ and the second digital sample value $Q(t_n)$ which are output from the first and second A/D converters 23 and 24 to correct errors occurring due to the errors of the phase shifter 22, and errors a characteristic difference between the first and second A/D converters 23 and 24, input to the error correction unit 25 for outputting two signals having a first and second digital sample values $I(t_n)'$ and $Q(t_n)'$ having phases diagonal to each other and the same amplitude and having no direct current offset error.

The error correction unit 25 is configured of an offset correction unit 26, a phase correction unit 27 and an amplitude correction unit 28.

That is, the error correction unit 25 comprises an offset correction unit 26, a phase correction unit 27, and an amplitude correction unit 28. The offset correction unit 26 corrects the direct current offset errors respectively generated in the first digital sample value $I(t_n)$ and the second digital sample value $Q(t_n)$ which are output from the first A/D converter 23 and the second A/D converter 24. The phase correction unit 27 corrects the phase error with respect to 90 degrees generated between a first digital sample value $I(t_n)$ and a second digital sample value $Q(t_n)$ in which the direct current offset error are already corrected by the offset correction unit 26. The amplitude correction unit 28 corrects the amplitude error generated between a first digital sample value $I(t_n)$ and a second digital sample value $Q(t_n)$ in which the phase error with respect to the 90 degrees are already corrected by the phase correction unit 27.

In the beginning, the offset correction unit 26, as shown in FIG. 2, comprises first and second subtractors 26a and 26b and first and second calculators 26c and 26d. The first and second subtractors 26a and 26b respectively receive at each one end thereof the first digital sample value $I(t_n)$ and the second digital sample value $Q(t_n)$ which are respectively input. The first and second calculators 26c and 26d respectively calculate correction values Hi and Hq for correcting each of the direct current offset error by calculation of average values with respect to output values $Ia(t_n)$ and $Q(t_n)$ from the first and second subtractors 26a and 26b, and output the correction values Hi and Hq to each another end of the first and second subtractors 26a and 26b.

Here, the following relations are established between the respective digital sample values $I(t_n)$ and $Q(t_n)$, respective correction values Hi and Hq, and respective output values $Ia(t_n)$ and $Qa(T_n)$.

In the following explanation, symbols $(t_n)$ indicative of the respective digital sample values, the correction values and the output values are omitted.

$Ia=I-Hi$ $Qa=Q-Hq$

Since the correction values Hi and Hq are correction values for taking to zero the average values of each of the output values Ia and Qa, the following equations are established.

$<Ia>=<I+Hi>=<I>-Hi=0$ $<Qa>=<Qa-Hq>=<Q>-Hq=0$ (Here, symbol $<X>$ shows an average value of x. The same holds true of the following).

Furthermore, when the amplitudes of the digital sample values I and Q are set to A and B, respective direct current offsets are set to Di and Dq, and a phase error (including a difference between the angle β and 90 degrees) with respect to 90 degrees of the sample value Q with respect to each digital sample values I, respective digital sample values I and Q which are input to the error correction unit 25 can be represented by the following equation.

$I=Di+A \cos \omega t_n$ (provided that $\omega=2\pi fr$ is established. The same holds true of the following).

$Q=Dq+B \sin(\omega t_n+\alpha)$

Consequently, each of the correction values Hi and Hq is represented in the following manner.

$$Hi = <I>$$
$$= <Di + A\cos\omega t_n>$$
$$= Di + <A\cos\omega t_n>$$

$$Hq = <Q>$$
$$= <Dq + B\sin(\omega t_n + \alpha)>$$
$$= Dq + <B\sin(\omega t_n + \alpha)>$$

Here, since the pulse signal p is input in an asynchronic manner (that is, at a random timing) to signals i(t) and q(t) having a sine wave, the following equation is established with a certain increase of the input times (for example, 10 times or more) of the pulse signal p.

$<A \cos \omega t_n>=0$ $<B \sin(\omega t_n+\alpha)>=0$

The respective correction values Hi and Hq become equal to the direct current offsets Di and Dq.

Consequently, the output values Ia and Qa are represented by the following equation.

$Ia=A \cos \omega t_n$ $Qa=B \sin(\omega t_n+\alpha)$

Consequently, the output values are corrected such that each of the direct current offset errors is cancelled from the input digital sample values I and Q.

Incidentally, in FIG. 2, correction values are determined in which the average of the output values of the first and second subtractors 26a and 26b is take to zero. However, the average values of the input digital sample values I and Q may be respectively determined, so in such a manner that the average values are used as correction values and the average values are respectively subtracted from the digital sample values I and Q.

In this manner, the digital sample values Ia and Qa in which each of the direct current offset errors is already corrected by the offset correction unit 26 are output to the phase correction unit 27.

As shown with a solid line in FIG. 3, the phase correction unit 27 for correcting (or reversing) the phase of the digital sample value Qa with reference to the phase of the input digital sample value Ia comprises a subtractor 27a for receiving at one end thereof the digital sample value Qa, a first multiplier 27b for determining a sum of the output value Qb of the subtractor 27a and the digital sample value Ia, a calculator 27c for determining a correction coefficient P for taking to zero an average value of the sum which is determined from the first multiplier 27b, and a second multiplier 27b for determining a product of the correction coefficient P determined by the calculator 27 and the digital sample value Ia to output the calculation result to the other end of the subtractor 27a.

The phase correction process by means of this phase correction unit 27 is performed in the following calculation by using a characteristic wherein the average of the correlative value (a sum) of the signals having diagonal phases becomes zero.

$$Qb = Qa - P \cdot Ia$$

Here, since the correction coefficient P serves to take the average value of the output value Ia and Qb to zero, the following relation is established.

$$\begin{aligned}
<Ia \cdot Qb> &= <Ia(Qa - P \cdot Ia)> \\
&= <Ia \cdot Qa - P \cdot Ia^2> \\
&= <Ia \cdot Qa> - P \cdot <Ia^2> \\
&= 0
\end{aligned}$$

$$P = <Ia \cdot Qa> / <Ia^2>$$

Here, the following equation is represented.

$$<Ia \cdot Qa> = <\{A\cos\omega t_n\}\{B\sin(\omega t_n + \alpha)\}>$$

When this equation is deformed by using a relation the sum total and the product of the trigonometric function of a half angle, the following result is obtained.

$$\begin{aligned}
&= <AB/2\{\sin(2\omega t_n + \alpha) + \sin(\alpha)\}> \\
&= <AB/2\{\sin(2\omega t_n + \alpha)\}> + <AB/2\{\sin(\alpha)\}> \\
&= (AB/2)\sin\alpha
\end{aligned}$$

Then the following equation is represented.

$$<Ia^2> = <\{A\cos(\omega t_n)\}^2>$$

When the this equation is deformed by using a relation the sum total and the product of the trigonometric function of a half angle, the following result is obtained.

$$\begin{aligned}
&= <A^2(1 + \cos(2\omega t_n))/2> \\
&= <A^2/2> + <A^2/2)(\cos(2\omega t_n)>
\end{aligned}$$

Here, the first item $<A^2/2>$ on the right side is a constant and the second item $<A^2/2)(\cos(2\omega t_n)>$ on the right side is converged to zero at any rate, the following result is obtained.

$$= A^2/2$$

Consequently, the correction coefficient P is provided as follows.

$$P = (AB/2)\sin\alpha/(A^2/2) = (B/A)\sin\alpha$$

When the output value Qb after the correction is represented by using the correction coefficient P, the following result is obtained.

$$\begin{aligned}
Qb &= Qa - P \cdot Ia \\
&= B\sin(\omega t_n + \alpha) - (B/A)\sin\alpha \cdot A\cos\omega t_n \\
&= B\cos\alpha \cdot \sin(\omega t_n)
\end{aligned}$$

In this manner, the phase of the output value Qb after correction runs at right angle with Ia.

However, the amplitude of the output value Qb after correction decreases to B cos α from the original value B.

Here, the value of the phase difference α can be determined from the relation of the correction coefficient P=(B/A)sin α and the detection process of the amplitudes A and B. Since cos α can be also determined, it is possible to prevent the occurrence of the amplitude error which accompanies the phase correction by means of the phase correction unit 27 through the division of cos α with respect to the output value Qb after the phase correction.

However, the amplitude error which accompanies the phase correction process by means of the phase correction unit 27 can be corrected in a lump together with another error component in the process of the next amplitude correction unit 28. For this reason, the amplitude correction is not performed in this phase correction process.

Furthermore, in the phase correction process by means of the phase correction unit 27, in the case where the phase error α is either equal to or approximate to ±90 degrees, namely, in the case where the phases of two signals before correction are approximately the same with or approximately reverse to each other, cos α becomes zero or a minimum value. Consequently, there arises in the above calculation a disadvantage that the output value Qb after correction becomes zero or a minimum value. For this reason, it is required that the angle β of the phase shifter 22 is separated by 0 degrees or a vicinity thereof, or by 180 degrees or the vicinity thereof including its error.

Incidentally, the phase correction unit 27 in the case of correcting the phase of the sample value Ia with reference to the phase of the input sample value Qa comprises, as shown with a broken line in FIG. 3, a subtractor 27a for receiving at one end the digital sample value Ia, a first multiplier 27b for determining a product of the output value Ib of the subtractor 27a and the digital sample value Qa, a calculator 27c for determining a first correction coefficient P for taking to zero an average value of the product determined by the first multiplier 27b, and a second multiplier 27d for determining a product of the first correction coefficient P determined by the calculator 27c and the sample value Qa to output the calculation result to another end of the subtractor 27a.

Consequently, the phase correction unit 27 may comprise a subtractor 27a, a first multiplier 27b, a calculator 27c, and a second multiplier 27d. The subtractor 27a receives at one end thereof a first digital sample value $Ia(t_n)$ in which the direct current offset error is already corrected by the offset correction unit 26 or a second digital sample value $Qa(t_n)$ in which the direct current offset error is already corrected by the offset correction unit 26 as shown with a solid line or a broken line in FIG. 3. The first multiplier 27b determines a product of an output value Ib corresponding to a first digital sample value $Ia(t_n)$ or an output value Qb corresponding to a second digital sample value $Qa(t_n)$ output from the subtractor 27a, and the second digital sample value $Qa(t_n)$ or the first digital sample value $Ia(t_n)$. The calculator 27c determines a second correction coefficient P for taking to zero an average value of the product output from the first multiplier 27b. The second multiplier 27*d* determines a product of the second correction coefficient P determined by the calculator 27*c* and the second digital sample value Qa($t_n$) or the first digital sample value Qa, and outputs the product to another end of the subtractor 27*a*.

Next, the amplitude correction unit 28 for correcting an amplitude error resulting from a gain difference or the like of the phase shifter 22 and the A/D converters 23 and 24 comprises a first subtractor 28*a*, a first multiplier 28*b*, a second multiplier 28*c*, a second subtractor 28*d*, a calculator 28*e*, and a third multiplier 28*f*. The first subtractor 28*a* receives at one end thereof the input digital sample value Qb as shown with a solid line in FIG. 4 in the case of correcting the amplitude error of the input digital sample value Qb with reference to the amplitude of the input digital sample value Ia (this may be the opposite relation). The first multiplier 28*b* calculates a square of the input digital sample value Ia. The second multiplier 28*c* calculates a square of the output value Qc from the first subtractor 28*a*. The second subtractor 28*d* determines a difference in respective outputs from the first and second multipliers 28*b* and 28*c*. The calculator 28*e* determines a third correction coefficient G for taking to zero an average value of the output from the second subtractor 28*d*. The third multiplier 28*f* determines a product of the third correction coefficient G from the calculator 28*e* and the input digital sample value Qb, and to supply the calculation result to another end of the first subtractor 28*a*.

In the amplitude correction process by means of the amplitude correction unit 28, the following calculation is performed:

$$Qc = Qb - G \cdot Qb = (1-G)Qb.$$

Here, since the correction coefficient G is a value for taking the average value of an output from the subtractor 28*d* to zero, the following equation is established.

$$\langle Qc^2 - Ia^2 \rangle = \langle Qb^2(1-G)^2 - Ia^2 \rangle$$
$$= \langle Qb^2 \rangle (1-G)^2 - Ia^2 \rangle$$
$$= 0$$
$$(1-G)^2 = \langle Ia^2 \rangle / \langle Qb^2 \rangle$$

Here, the following equation is represented.

$$\langle Ia^2 \rangle = \langle A^2 \cos \omega t_n^2 \rangle$$

In the same manner as described above, the following result is obtained in the end.

$$= A^2/2$$

Furthermore, the following equation is established.

$$\langle Qb^2 \rangle = \langle B \sin s\omega t_n^2 \rangle.$$

In the same manner as described above, the following result is obtained in the end.

$$= B^2/2$$

Consequently, the following equation is established.

$$1-G = A/B$$

However, from the condition of A/B>0, G<1 is obtained.

Accordingly, the output value Qc after correction is set to the following:

$$Qc = Qb - G \cdot Qb$$
$$= (1-G) \cdot Qb$$
$$= (A/B) \cdot B \sin \omega t_n$$
$$= A \sin \omega t_n.$$

The amplitude of the output value Qc agrees with the amplitude A of the other output value Ia.

In each of the correction processes described above, the digital sample values I' and Q' which are output from the error correction unit 25 are given as follows.

$$I' = Ia = A \cos \omega t_n$$

$$Q' = Qc = A \sin \omega t_n$$

The digital sample values are values in which the amplitudes accurately agree, and which are obtained by sampling the signals having a fluctuation which accurately agree with each other and phases which run at right angle with each other at the same timing.

Incidentally, as will be described later, this relation becomes the same in the case where the amplitude error of the input digital sample value Ib is corrected with reference to the amplitude of the input digital sample value Qa.

Figure 4:
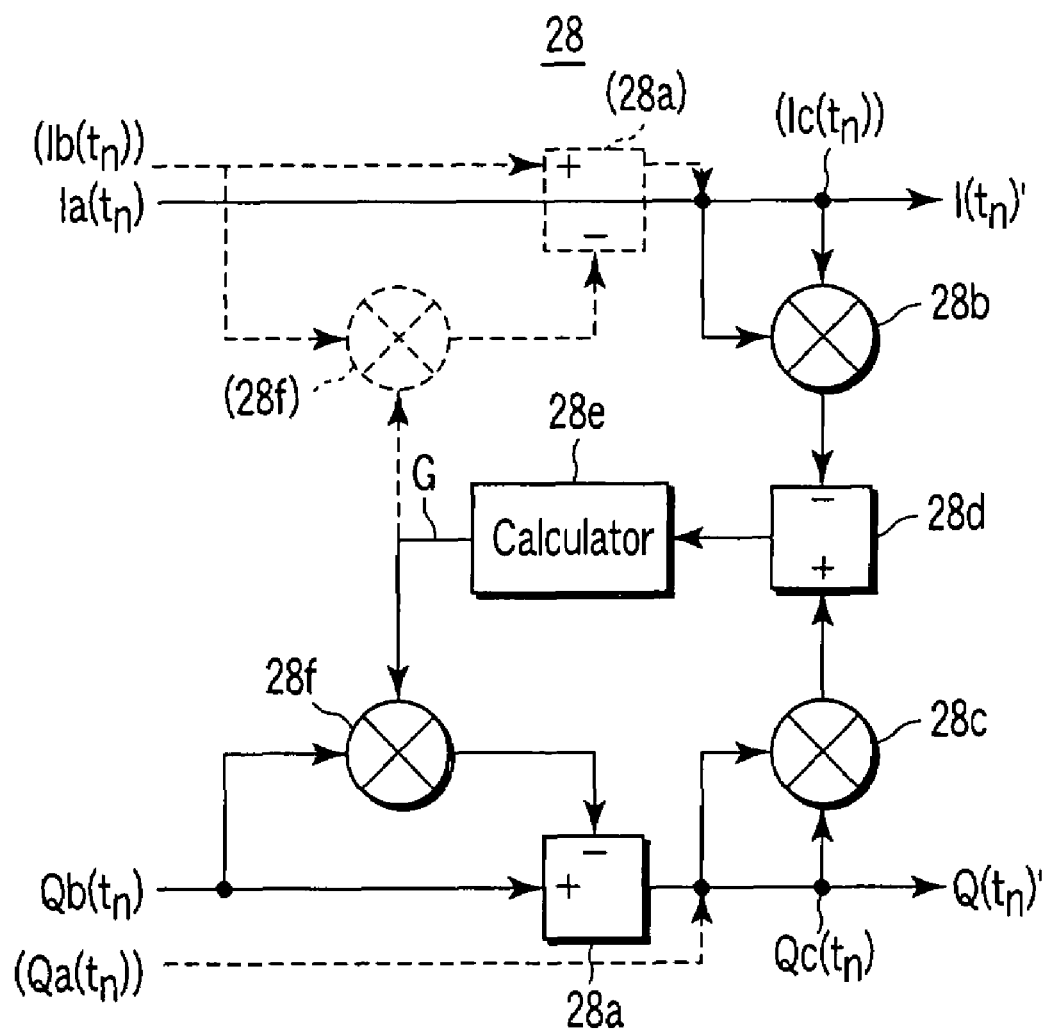
FIG. 4 is a block diagram showing a configuration of an amplitude correction unit 28 in the error correction unit 25 as a configuration example of an essential portion of FIG. 1.

More specifically, the amplitude correction unit 28 for correcting an amplitude error generated with a gain difference or the like of the phase shifter 22 and the A/D converters 23 and 24 comprises a first subtractor 28*a* for receiving at one end thereof a first digital sample value Ib which is corrected the phase error with respect to 90 degrees by the phase correction unit 27 as shown by a broken line in FIG. 4 in the case of correcting the amplitude error of the input digital sample value Ib with reference to the fluctuation of the input digital sample value Qa; a first multiplier 28*c* for calculating a square of a second digital sample value Qa which is corrected the direct current offset error; a second multiplier 28*b* for calculating a square of the output value Ic from the first subtractor 28*a*; a second subtractor 28*d* for determining a difference between respective outputs from the first and second multipliers 28*c* and 28*b*; a calculator 28*e* for determining a third correction coefficient G for taking an average value of the output from the second subtractor 28*d* to zero; and a third multiplier 28*f* for determining a product of the third correction coefficient G from the calculator 28*e* and a first digital sample value Ib which is corrected the phase error with respect to the 90 degrees to supply the calculation result to the other end of the first subtractor 28*a*.

Consequently, the amplitude correction unit 28, as shown with a solid line or a broken line in FIG. 4, may comprise a first subtractor 28*a*, a first multiplier 28*b*, a second multiplier 28*c*, a second subtractor 28*d*, a calculator 28*e*, and a third multiplier 28*f*. The first subtractor 28*a* receives at one end thereof a first digital sample value Ib($t_n$) in which the phase error with respect to the 90 degrees is already corrected by the phase correction unit 27 or a second digital sample value Qb($t_n$) in which the phase error with respect to the 90 degrees is already corrected by the phase correction unit 27. The first multiplier 28*b* or 28*c* calculates a square of a first digital sample value Ib($t_n$) in which the direct current offset error is already corrected or a second digital sample value Qb($t_n$) in which the direct current offset error is already corrected. The second multiplier 28c or 28b calculates a square of an output value (Ic or Qc) from the first subtractor 28a. The second subtractor 28d determines a difference between respective outputs from the first and second multipliers 28b or 28c and 28c or 28b. The calculator 28e determines a fourth correction coefficient G for taking an average value of the output from the second subtractor 28d to zero. The third multiplier 28f determines a product of the fourth correction coefficient G determined by the calculator 28e and a first digital sample value $Ib(t_n)$ in which the phase error with respect to the 90 degrees is already corrected or a second digital sample value $Qb(t_n)$ in which the phase error with respect to the 90 degrees is already corrected, and outputs the product to another end of the first subtractor 28a.

Incidentally, the technique of each of the correction processes by means of the correction units is not intended to limit the present invention, other correction techniques may be used.

Furthermore, as described above, in the case where the amplitude error generated in the phase correction is corrected by cos α in the phase correction unit 27, the amplitude correction process by means of the amplitude correction unit 28 may be performed prior to the phase correction process by means of the phase correction unit 27.

Furthermore, in each of the correction processing units of the error correction unit 25 having the configuration, a coefficient required for the correction of the averaging process with respect to the input digital sample value is demanded.

Consequently, in the technique for each of the correction processes, a correct correction process can be performed after the input of a certain number (for example, 10 or more) of pulse signals p to be measured.

A pulse signal for determining a coefficient required for this correction is not required to be a signal to be measured. As shown in FIG. 1, a pulse signal p' which is output from a pulse generator 30 is input to the A/D converters 23 and 24 via a switch 31 to determine a coefficient required for the error correction, whereby a pulse signal p to be measured may be input by changing over the switch 31.

However, the pulse generator 30 may output a pulse signal p' which is asynchronic to the reference signal r(t).

The digital sample values I' and Q' which are corrected each error in this manner are input to the instantaneous phase calculation unit 32.

The instantaneous phase calculation unit 32 determines a phase value (an instantaneous phase) φ of the reference signal r(t) at the time of the pulse input based on the following calculation, and outputs the value to the interval time calculation unit 35 which will be described later.

$$\phi = \tan^{-1}(Q'/I')$$

However, since tan φ is discontinuous when φ is an integer number times of ±π/2, tan φ becomes ± of infinite in the vicinity thereof, and thus, the precision of the calculation is deteriorated.

Consequently, here, the calculation range of the tangent (tan) is restricted to the range of 0 to π/4 to determine the phase value φ based on the value of (Q'/I') and the code of Q' and I' in the following manner.

Figure 5A:
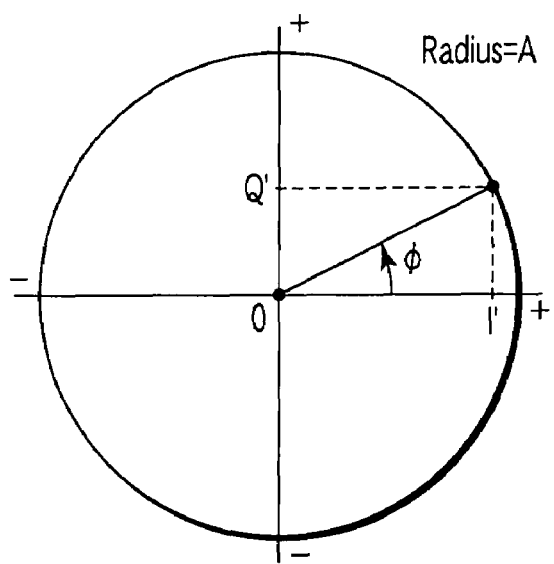
FIGS. 5A to 5D are views for explaining a phase calculation form by means of an instantaneous phase calculation unit 32 of FIG. 1.

That is, as shown in FIG. 5A, the phase value φ is set to the range of $0 \leq \phi < \pi/4$, in the case of $0 \leq (Q'/I') < 1$, $0 \leq Q'$, and $0 \leq I'$, the value can be determined with a good precision in a calculation of:

$$\phi = \tan^{-1}(Q'/I').$$

Figure 5B:
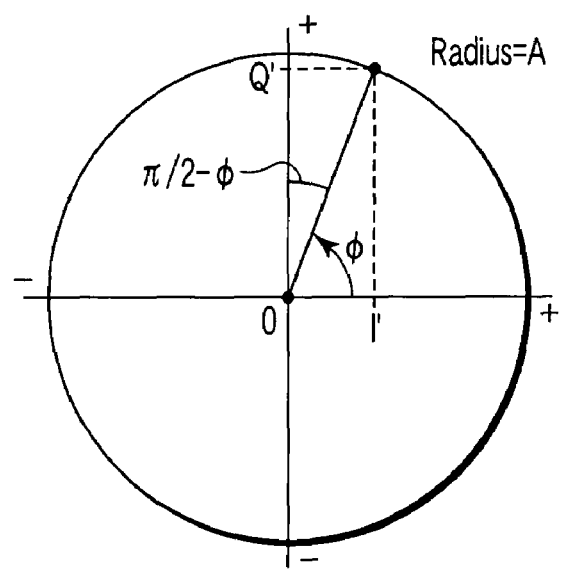

Further, as shown in FIG. 5B, the phase value φ in the case of $1 \leq (Q'/I')$, $0 \leq Q'$, and $0 \leq I'$ is set to the range of $\pi/4 \leq \Phi < \pi/2$, the sine value Q'/I' at this time is a reverse number of the sine value in (π/2−φ).

Therefore, the phase value φ in this case can be determined with a good precision in the following calculation.

$$\phi = (\pi/2) - \tan^{-1}(I'/Q')$$

Figure 5C:
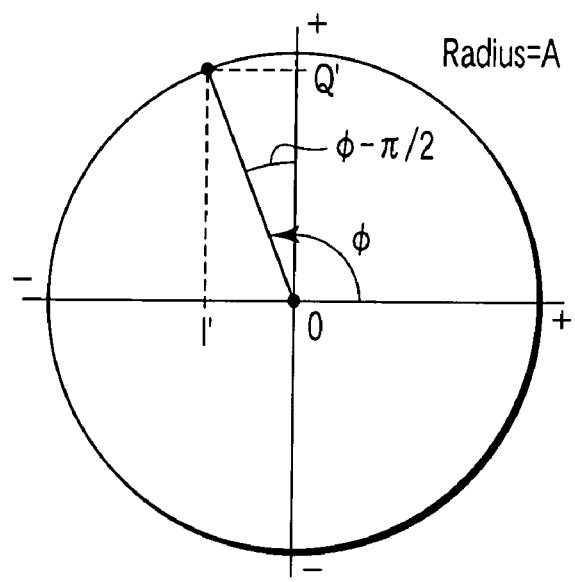

Furthermore, as shown in FIG. 5C, in the case of $(Q'/I') \leq -1$, $0 < Q'$, and $0 > I'$, the phase value φ is set to the range of $\pi/2 \leq \phi < 3\pi/4$, and the sine value Q'/I' at this time is equal to a reverse number of the sine value in (φ−π/2) and is equal to a code which is set to be negative.

Consequently, the phase value φ in this case can be determined with a good precision in the following calculation.

$$\phi = (\pi/2) + \tan^{-1}(-I'/Q')$$

Figure 5D:
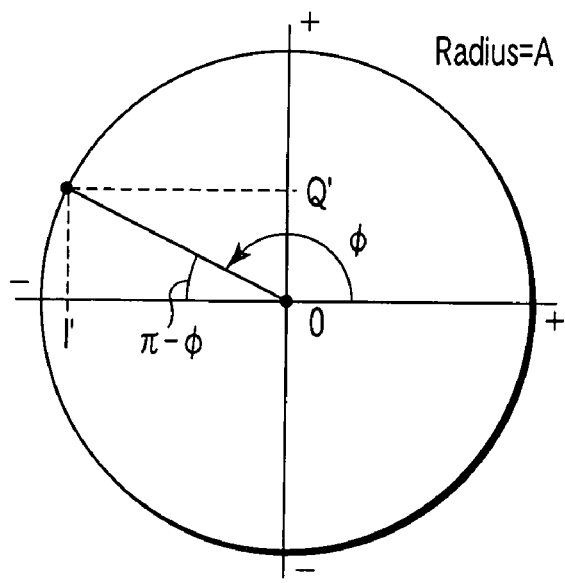

Furthermore, as shown in FIG. 5D, in the case of $(Q'/I') \leq -1$, $0 < Q'$, and $0 > I'$, the phase value φ is set to the range of $3\pi/4 \leq \phi < \pi$. The sine value Q'/I' at this time is equal to a negative of the code of the sine value at (π−φ).

Consequently, the phase value φ in this case can be determined with a good precision in the calculation of $$\phi = -\tan^{-1}(-Q'/I')$$

Hereinafter, in this manner, it is possible to accurately determine the phase value φ in a state in which the calculation range of the tangent (tan) is restricted to the range of 0 to π/4 by using code reversion and a reverse number of I' and Q' even in the range of the phase value ranging from π to 2π.

Then, when it is known in advance that the input interval time T of the pulse signal p is set to one period 1/fr of the reference signal r(t) of the sine wave or less (T≤1/fr), the instantaneous phase φ of the reference signal r(t) at the time when the pulse signal p to be measured is input to the A/D converters 23 and 24 is determined by the instantaneous phase calculation unit 32, so that the input interval time T of the pulse signal p can be accurately determined from a difference Δφ of the instantaneous phase φ.

Incidentally, the difference Δφ of the instantaneous phase can be represented by the following equation when the instantaneous phase at a certain pulse input timing t1 is set to φ1 and the instantaneous phase at a pulse input timing t2 is set to φ2 so that t1<t2 is established. The difference is represented by the following equation.

$$\Delta\phi = \phi2 - \phi1$$

However, there is a case in which Δφ becomes zero or less because the phase is normally represented in a range of 0 to 2π.

In such a case, the difference Δφ is represented by the following equation.

$$\Delta\phi = (\phi2 - \phi1 + 2\pi)$$

Then, in the case where the input interval time T is larger than one period 1/fr of the reference signal r(t) (T≥1/fr), as will be described later, it becomes necessary to provide a frequency multiplier 33 and a counter 34 to input a count value M by means of the counter 34 to the interval time calculation unit 35.

Incidentally, since the variation of the count value M is determined by the instantaneous time calculation unit 35 in this case, (φ−φ1+2π) is not set to Δφ even if Δφ is set to zero or less.

That is, as shown in FIG. 1, the time interval measuring apparatus 20 is provided with a frequency multiplier 33 for receiving a reference signal r(t) and generating a frequency multiplication signal m(t) having a frequency Nfr which is N times (N is an integer number of three or more) of the frequency fr of the reference signal r(t), and a counter 34 for counting a frequency multiplication signal m(t) output from the frequency multiplier 33.

Here, the frequency 33 can employ a configuration for distorting a waveform of the reference signal r(t) by a diode or the like to generate a high frequency component, and extracting a N-th high frequency wave from the high frequency component by a filter or the like.

Furthermore, the frequency multiplier 33 can employ a configuration by means of a phase synchronization loop (PLL) circuit, namely, a configuration for controlling a frequency of a voltage controlled oscillator (VCO) in such a manner that a signal of a frequency N times of the reference signal is output from the VCO, and an output from the VCO is divided to 1/N with a dividing circuit to allow the phase of the dividing output to be synchronized with the phase of the reference signal.

Incidentally, even with the frequency multiplier 33 in any case described above, it is not required that the phase of the frequency multiplication signal m(t) is synchronized with the phase of the reference signal r(t).

The interval time calculation unit 35 determines the input interval time T of the pulse signal p based on the phase value (the instantaneous phase) $\phi$ calculated by the instantaneous phase calculation unit 32 at every input of the pulse signal p and the count number M of the counter 34.

That is, the interval time calculation unit 35 determines the phase difference $\Delta\phi=\phi 2-\phi 1$ upon receipt of the phase value $\phi 1$ and the count number M1 at a certain pulse input timing t1, as well as the phase value $\phi 2$ and the count number M2 at the next pulse input timing t2, and also determines the stepping number $\Delta M=M2-M1$ of the frequency multiplication signal m(t), thereby calculating the input interval time T in the following equation.

$$T=\{1/(2\pi fr)\}(\Delta\phi+2\pi W)=(\Delta\phi/2\pi fr)+(W/fr)$$

Here, symbol W denotes a maximum integer number which does not exceed $(\Delta M/N)-(\Delta\phi/2\pi)+(½)$, and represents accurately for which period portions the phase of the reference signal has changed during the times t1 to t2 and in which rotation times the phase has been rotated.

Here, the stepping number $\Delta M$ may include an error of ±1 because the count time M of the counter 34 is affected by the jitter of the frequency multiplication signal m(t).

However, as described above, when the frequency multiplication signal m(t) of three times or more of the frequency fr of the reference signal is used, the input interval time T can be accurately determined without being affected by the error thereof in the W calculation.

Figure 6A:
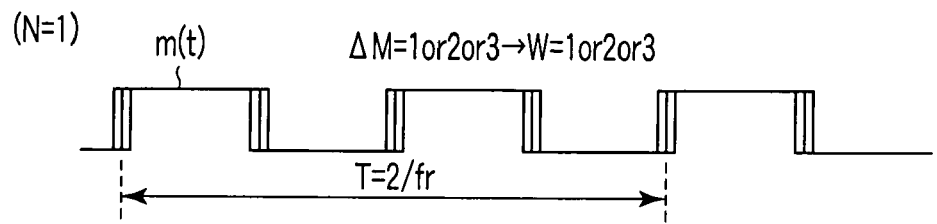
FIGS. 6A and 6B are views showing a relation between a multiplication number (N=1) of a multiplication signal by means of a multiplier 33 and a pulse input timing with respect to A/D converters 23 and 24.
Figure 6B:
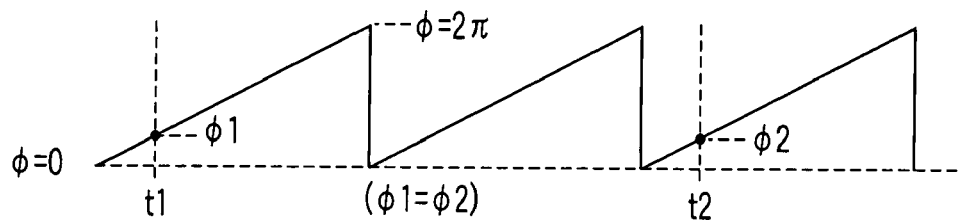

In the beginning, the case of N=1 is explained. A shown in FIGS. 6A and 6B, the case of T=2/fr (the case of $\Delta\phi=0$) is considered with N=1 (with no frequency multiplication number).

In this case, without jitters, $\Delta M=2$ should be established. However, in actuality, there is a possibility that $\Delta M$ becomes any of 3, 4 and 5. For this reason, the value of W can become any of 2 and 3, and the value of W cannot be specified to any one number.

Figure 7A:
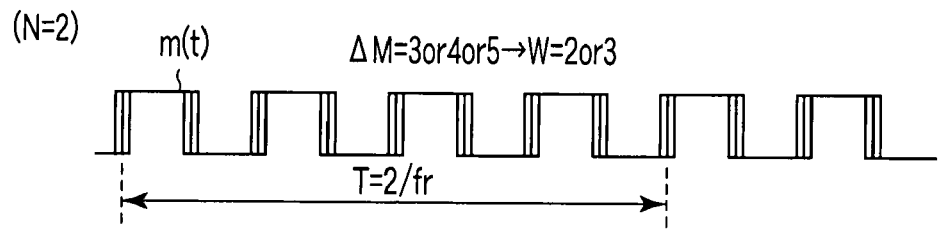
FIGS. 7A and 7B are views showing a relation between a multiplication number (N=2) of a multiplication signal by means of the multiplier 33 and a pulse input timing with respect to the A/D converters 23 and 24.
Figure 7B:
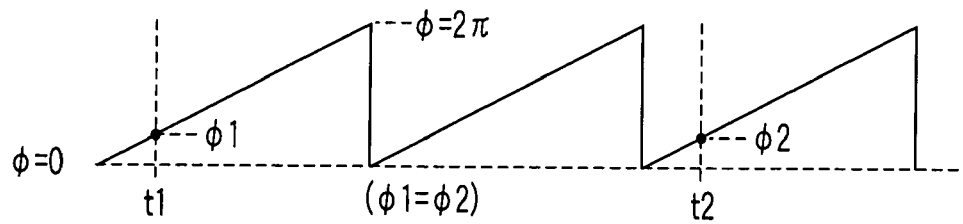

Next, as shown in FIGS. 7A and 7B, when case of N=2 and T=2/fr is considered. $\Delta M=4$ should be established in the absence of jitters. However, in actuality, there is a possibility that $\Delta M$ can be any of 5, 6 and 7 under of the influence of jitters. As a consequence, the value of W can be any of 2 and 3 and cannot be specified to one value.

Further, although not shown in the drawings, in the case where N=2, T=3/fr is established, $\Delta M=6$ should have been established in the absence of jitters. However, there is a possibility that $\Delta M$ can be any of 5, 6 and 7 under the influence of jitters. For this reason, the value of W can be any of 3 and 4, and cannot be specified to one value.

Figure 8A:
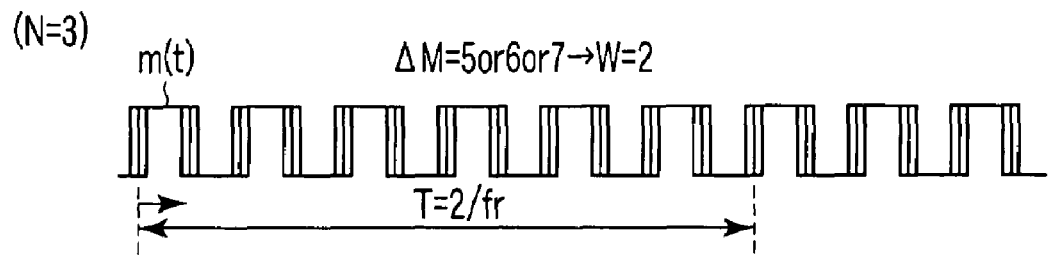
FIGS. 8A and 8B are views showing a relation between a multiplication number (N=2) of a multiplication signal by means of the multiplier 33 and a pulse input timing with respect to the A/D converters 23 and 24.
Figure 8B:
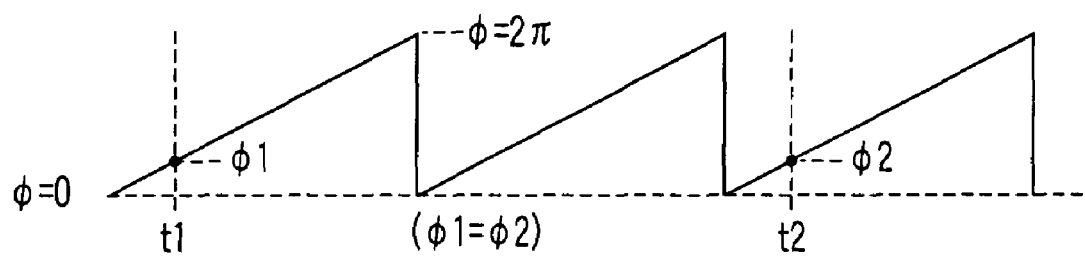

Furthermore, as shown in FIGS. 8A and 8B, in the case where N=3 and T=2/fr are established, $\Delta M=6$ should be established in the absence of jitters. However, there is a possibility that $\Delta M$ can become any of 5, 6 and 7 under the influence of jitters.

However, in this case, since N=3 is established, the W value can be specified to one value of 2, so that the input interval time T can be accurately determined.

In addition, although not shown in the drawings, in the case where N=3 is established and T=3/fr is also established, $\Delta M$ can be set to any of 8, 9 and 10. However, the value of W can be set to a value of 3, and as a result, the input interval time T can be accurately determined.

Hereinafter, in the same manner, even in the case where N=4 or more is established, the value of W can be specified to one value with respect to three continuous values which $\Delta M$ can take, and the rotation number of the phase of the reference signal between t1 to t2 can be accurately determined. As a consequence, the input interval time can be accurately determined.

Incidentally, in the explanation, there is explained a case in which the phase difference $\Delta\phi=0$ is established. However, with respect to the case in which $\Delta\phi=0$ is not established, it is possible to accurately determine the rotation number of the phase of the reference signal between t1 and t2 in the calculation of W, whereby the input interval time T can be accurately determined.

Figure 9:
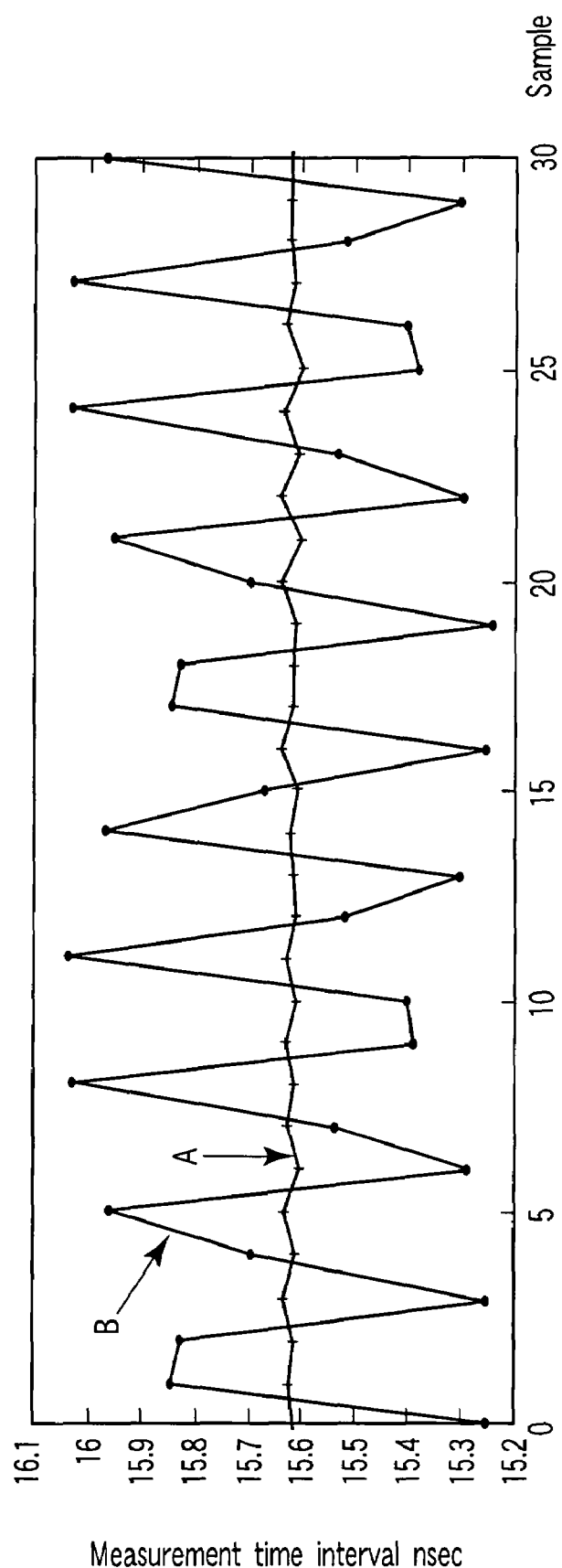
FIG. 9 is a view showing a time interval measurement result by means of the time interval measuring apparatus according to the first embodiment of the present invention in contrast with the time interval measurement result by the prior art.

FIG. 9 is a view showing a comparison of the two measurement results A and B in the time interval measuring apparatus 20 according to the embodiment; the measurement result A obtained in the case where a clock signal having a stable frequency of 64 MHz (having a period of 15.625 nsec) is input as a pulse signal p by setting the frequency fr of the reference signal r(t) to 10 MHz and setting the resolution of the A/D converters 23 and 24 to 14 bits, and the measurement result B obtained in the case where the correction process by means of the error correction unit 25 is not performed (the conventional apparatus).

As apparent from FIG. 9, in the case where no correction process is performed, an error of about 800 psec p-p (2.8 degrees into the phase conversion) is generated. In contrast, in the case where the correction process is performed, an error is suppressed to a level of about 40 psec p-p (0.14 degree into the phase conversion).

Consequently, according to the time interval measuring apparatus 20 according to the embodiment, an interval between bits of a 1 Gbps digital signal can be measured with a good precision.

In this manner, in the time interval measuring apparatus 20 according to the embodiment, the phase error, the amplitude error and the direct current offset errors between two signals which are generated in the phase shifter 22 and the A/D converters 23 and 24 are respectively corrected by the error correction unit 25 to determine the instantaneous phase at two different input timings of the pulse signal p, so that the input interval time T of the pulse signal p is determined based on the difference $\Delta\phi(=\phi 2-\phi 1)$ of the two instantaneous phases $\phi 1$ and $\phi 2$ (provided that T≦1/fr is established).

Accordingly, an extremely precise measurement can be stably performed without doing a fine adjustment work with respect to the phase shifter 22 and the A/D converters 23 and 24 and without being affected by the environmental changes.

Further, in the time interval measuring apparatus 20 according to the embodiment, the frequency of the reference signal r(t) is multiplied by the multiplier 33 having a multiplication number of 3 or more, and the multiplication value of the frequency is counted with the counter 34 at two different input timings of a pulse signal p, so that the input interval time T of the pulse signal p is calculated based on the difference ΔM (=M2−M1) of the count values M1 and M2 and the instantaneous phase difference Δϕ (provided that T≧fr is established).

In this case, there is provided an advantage in that the configuration can be simple because the input interval time T of a period of the reference signal or more can be measured with a good precision without being affected by the jitter of the multiplication number while the phase synchronization process of the reference signal and the multiplication signal of the frequency is not required.

Second Embodiment

The minimum measurement time Tmin of the time interval measuring apparatus 20 having a configuration according to the first embodiment is determined with an upper limit fmax of the sampling frequency of the A/D converters 23 and 24.

That is, the minimum measurement time is set to Tmin≧1/fmax, with the result that there is a limitation that the input interval time which is shorter than the time described above cannot be measured.

Figure 10:
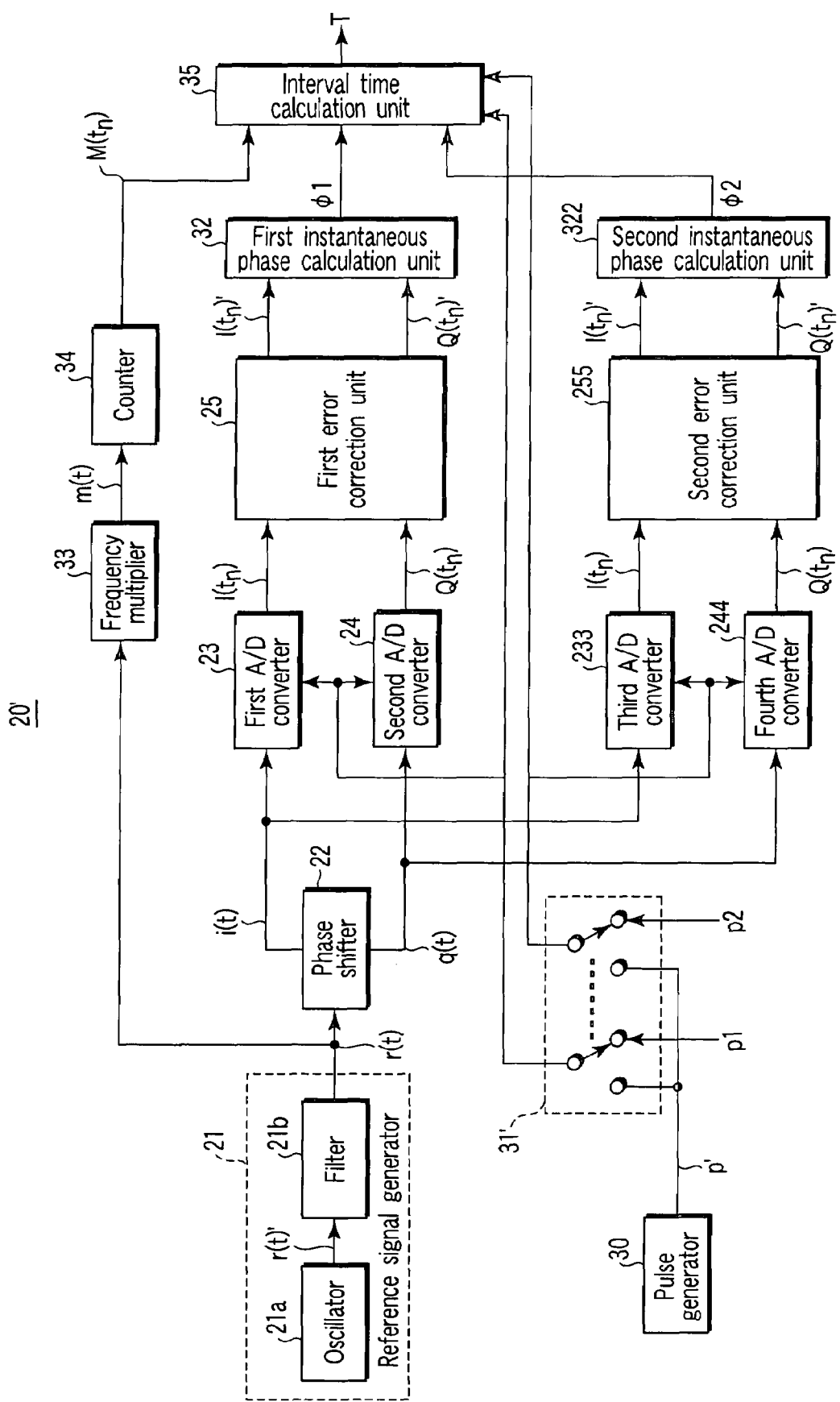
FIG. 10 is a block diagram showing a configuration of a time interval measuring apparatus 20' according to a second aspect of the present invention.

Then, in a time interval measuring apparatus 20' according to a second embodiment, as shown in FIG. 10, one set of the A/D converters 23 and 24, and the error correction units 25 and instantaneous phase calculation units 32 according to the first embodiment are provided as two sets respectively, whereby the lower limit of the measurement time can be eliminated.

More specifically, only with one set of A/D converters 23 and 24, the error correction unit 25 and the instantaneous phase calculation unit 32 according to the first embodiment, the minimum measurement time Tmin as the time interval measuring apparatus 20 is limited to a level not higher than the upper limit fmax of the sampling frequency of the A/D converters 23 and 24.

In contrast, with the adoption of a configuration in which one set of the A/D converters 23 and 24 and the error correction units 25 and instantaneous phase calculation units 32 according to the first embodiment are provided as two sets respectively, the following advantage is obtained. That is, a pulse signal p to be input is subjected to the A/D conversion one after another with each set of A/D converters in such a manner that, while a pulse signal p to be input at a first input timing is subjected to A/D conversion with one set of A/D converters, a pulse signal p to be input at a second input timing is subjected to A/D conversion with another set of A/D converter. Consequently, the lower limit of the measurement time is substantially eliminated, and the input interval time can be measured from zero.

FIG. 10 is a block diagram showing a configuration of the time interval measuring apparatus 20' according to the second embodiment of the present invention.

That is, the time interval measuring apparatus 20' according to the second embodiment of the invention basically comprises a reference signal generator 21, a phase shifter 22, a first analog/digital (A/D) converter 23, a second A/D converter 24, a first error correction unit 25, a first instantaneous phase calculation unit 32, a third A/D converter 233, a fourth A/D converter 244, a second error correction unit 255, a second instantaneous phase calculation unit 322, and an interval time calculation unit 35. The reference signal generator 21 generates a reference signal r(t) of a sine wave having a predetermined frequency. The phase shifter 22 receives the reference signal r(t) generated by the reference signal generator 21, and outputs a first analog signal i(t) and a second analog signal q(t) whose phases are shifted each other. The first A/D converter 23 performs sampling of the first analog signal i(t) which is output from the phase shifter 22 at an input timing of a pulse signal p1 for the start of time interval measurement, converts a value obtained by the sampling into a first digital sample value I($t_n$), and outputs the first digital sample value I($t_n$). The second A/D converter 24 performs sampling of the second analog signal q(t) which is output from the phase shifter 22 at the input timing of the pulse signal p1 for the start of time interval measurement, converts a value obtained by the sampling into a second digital sample value Q($t_n$), and outputs second digital sample value Q($t_n$). The first error correction unit 25 receives the first digital sample value I($t_n$) and the second digital sample value Q($t_n$) which are output from the first A/D converter 23 and the second A/D converter 24, and respectively corrects direct current offset errors respectively generated in the first digital sample value I($t_n$) and the second digital sample value Q($t_n$), and a phase error with respect to 90 degrees and an amplitude error which are generated in the first digital sample value I($t_n$) and the second digital sample value Q($t_n$), the errors being generated by the phase shifter 22, the first A/D converter 23 and the second A/D converter 24. The first instantaneous calculation unit 32 calculates a first instantaneous phase ϕ1 of the reference signal at the input timing of the pulse signal p1 for the start of time interval measurement based on the first digital sample value I($t_n$)' and the second digital sample value Q($t_n$)' in which the errors are already corrected by the first error correction unit 25. The third A/D converter 233 performs sampling of the first analog signal i(t) which is output from the phase shifter 22 at an input timing of a pulse signal p2 for the end of time interval measurement, converts a value obtained by the sampling into a third digital sample value I($t_n$), and outputs the third digital sample value I($t_n$). The fourth A/D converter 244 performs sampling of the second analog signal q(t) which is output from the phase shifter 22 at the input timing of the pulse signal p2 for the end of time interval measurement, converts a value obtained by the sampling into a fourth digital sample value Q($t_n$), and outputs the fourth digital sample value Q($t_n$). The second error correction unit 255 receives the third digital sample value I($t_n$) and the fourth digital sample value Q($t_n$) which are output from the third A/D converter 233 and the fourth A/D converter 244, and respectively corrects direct current offset errors respectively generated in the third digital sample value I($t_n$) and the fourth digital sample value Q($t_n$), and a phase error with respect to 90 degrees and an amplitude error which are generated between the third digital sample value I($t_n$) and the fourth digital sample value Q($t_n$), the errors being generated by the phase shifter 22, the third A/D converter 233 and the fourth A/D converter 244. The second instantaneous phase calculation unit 322 calculates a second instantaneous phase ϕ2 of the reference signal r(t) at the input timing of the pulse signal p2 for the end of time interval measurement based on the third digital sample value I($t_n$)' and the fourth digital sample value Q($t_n$)' in which the errors are already corrected by the second error correction unit 255. The interval time calculation unit 35 determines as a variation Δϕ of instantaneous phases a difference between the first instantaneous phase ϕ1 and the second instantaneous phase ϕ2 which are respectively calculated by the first instantaneous phase calculation unit 32 and the second instantaneous phase calculation unit 322, and determines an input interval time T of the pulse signal p1 for the start of time interval measurement and the pulse signal p2 for the end of time interval measurement based on the variation $\Delta\phi$ of the instantaneous phases.

In this manner, in the time interval measuring apparatus 20' according to the second embodiment described above, a phase error, an amplitude error and a direct current offset error between two signals which errors are generated by the phase shifter 22, the first and the second A/D converter 23 and 24 as well as the phase shifter 22, and the third and fourth A/D converters 233 and 244 are corrected by the first and the second error correction units 25 and 255, and the instantaneous phases are determined at two different input timings of the pulse signal p. Consequently, an input interval time T of the pulse signal p is determined based on the difference $\Delta\phi(=\phi2-\phi1)$ of the two instantaneous phases $\phi1$ and $\phi2$ (provided that T≦fr is established).

As a consequence, it is possible to stably perform an extremely precise measurement without doing a fine adjustment work with respect to the phase shifter 22 and the A/D converters 23, 24, 233 and 244, and furthermore, without being affected by the environmental changes.

Incidentally, with respect to the details of the first and second error correction units 25 and 255, the offset correction unit 26 shown in FIG. 2, the phase correction unit 27 shown in FIG. 3, and the phase correction unit 28 and the amplitude correction unit 29 can be used in the same manner as the error correction unit 25 in the time interval measuring apparatus 20 according to the first embodiment described above.

Furthermore, the time interval measuring apparatus 20' according to the second embodiment of the present invention comprises a frequency multiplier 33 for receiving a reference signal r(t) generated by the reference signal generator 21 and generating a frequency multiplication signal m(t) which is obtained by multiplying the frequency of the reference signal r(t) by a multiplication number of 3 or more, and a counter 34 for counting the frequency multiplication signal m(t) output from the frequency multiplication signal 33.

The interval time calculation unit 35 obtains a first count value M1 from the counter 34 at the input timing of the pulse signal p1 for the start of time interval measurement and a second count value M2 from the counter 34 at the input timing of the pulse signal p2 for the end of time interval measurement, determines a difference between the first count value M1 and the second count value M2 as a variation $\Delta M$ of the count values, and determines an input interval time T of the pulse signal p1 for the start of time interval measurement and the pulse signal p2 for the end of time interval measurement based on the variation $\Delta M$ of the count values and the variation $\Delta\phi$ of the instantaneous phases.

In this time interval measuring apparatus 20', a pulse signal p1 which is indicative of the start of the time measurement is input to one set of A/D converters 23 and 24 while a pulse signal p2 which is indicative of the end of the time measurement is input to another set of A/D converters 23 and 24. Consequently, the phase values (the instantaneous phase value) $\phi1$ and $\phi2$ are respectively calculated by respective sets of the instantaneous phase calculation units 32 and 32, and the calculation result is input to the instantaneous time calculation unit 35.

Then, in the interval time calculation unit 35, a difference between the phase values $\phi1$ and $\phi2$ is determined as a variation of the instantaneous phases in the manner, a difference $\Delta M$ between the count values M1 and M2 of the counter 34 is determined as a variation of the count values. Based on these variations, an input interval T of the pulse signals p1 and p2 is determined.

In this case, there is provided an advantage in that the configuration can be simple because it is possible to measure with a good precision the input interval time T of a period of the reference signal or more without being affected by the reference signal while the phase synchronization process of the reference signal and the multiplication signal is not required.

Incidentally, when a pulse signal p' is input to a pulse generator 30 for determining a correction coefficient in the case of the embodiment shown in FIG. 10, the pulse signal p' is changed over with the pulse signals p1 and p2 to be measured by using a dual-type switch 31'.

Third Embodiment

Figure 11A:
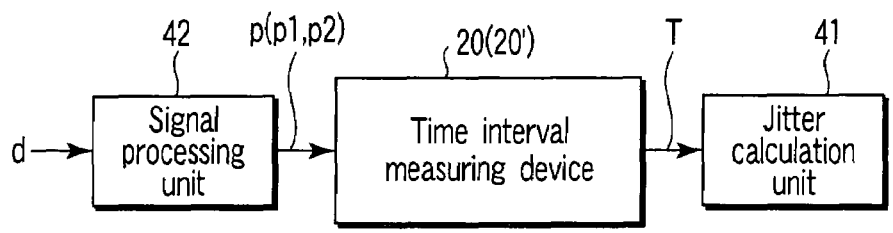
FIG. 11A is a block diagram showing a configuration of a jitter measuring apparatus including the time interval measuring apparatus 20 according to the first embodiment of the invention or the time interval measuring apparatus 20' according to the second aspect of the present invention.

FIG. 11A is a block diagram showing a configuration of a jitter measuring apparatus 40 according to a third embodiment of the present invention.

As shown in FIG. 11A, the jitter measuring apparatus 40 according to the third embodiment of the invention basically comprises a signal processing unit 42, the time interval measuring apparatus 20 according to the first embodiment described above or the time interval measuring apparatus 20' according to the second embodiment (refer to FIG. 1 or 10), and a jitter calculation unit 41.

That is, the time interval measuring apparatuses 20 and 20' configured according to the first and second embodiments is not simply constituted as a apparatus for interval time measurement. In addition, as shown in FIG. 11A, the jitter measuring apparatus 40 can be constituted by using the jitter calculation unit 41 for calculating a statistics amount with respect to jitters from a calculated time T, and the signal processing unit 42 for creating a pulse signal p to be measured from an input signal d.

Figure 11B:
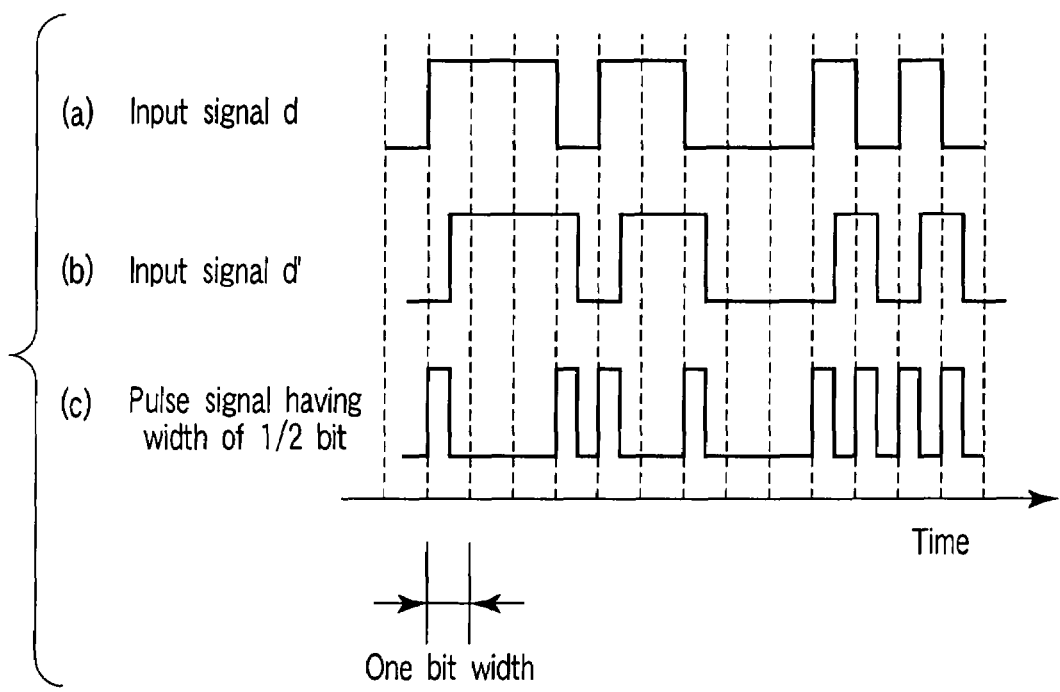
FIG. 11B is a timing chart shown for explaining a processing form in the case where an input signal which is treated by a signal processing unit 42 of FIG. 11A is a data signal of an NRZ code.
Figure 12:
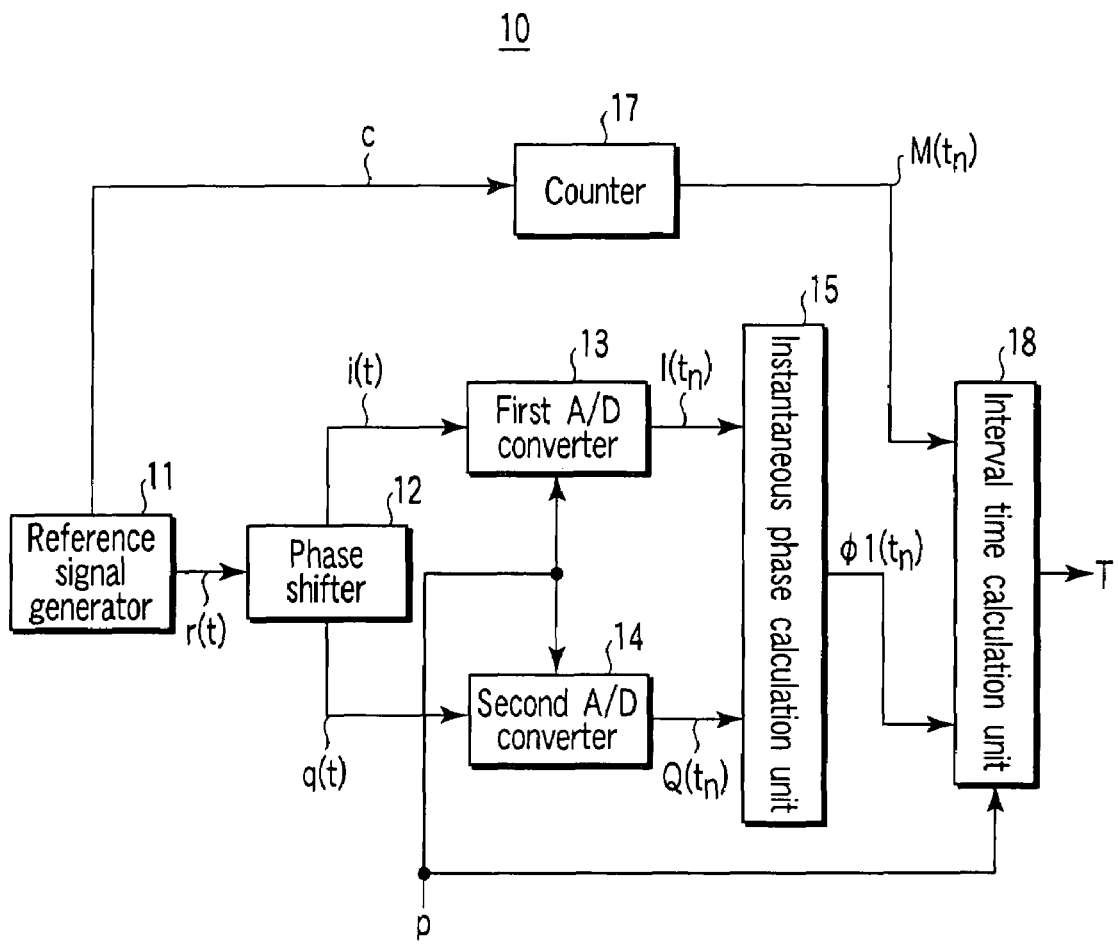
FIG. 12 is a block diagram showing a configuration of a time interval measuring apparatus by the prior art in which a period measuring method and a phase measuring method are combined.
Figure 13:
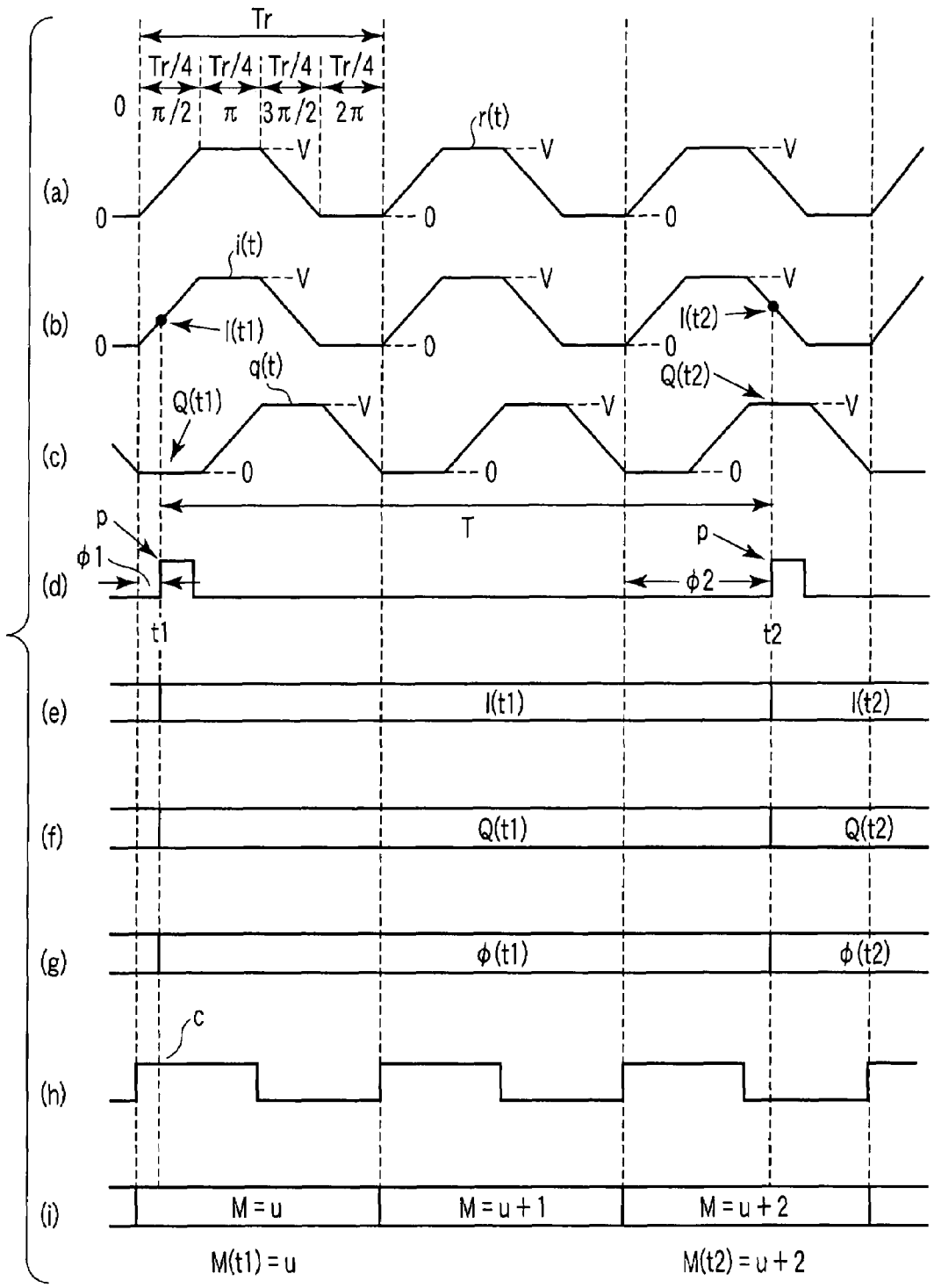
FIG. 13 is a view for explaining an operation of a time interval measuring apparatus in the prior art shown in FIG. 12.

Here, in the case where the input signal d is, for example, a data signal of an NRZ (non-return-zero) code as shown in FIG. 11B, it is necessary to evaluate jitters at the rise which moves from a space of the data signal to a mark and jitters at the fall which moves from the mark to the space.

As a consequence, the signal processing unit 42 takes an exclusive sum (EX-OR) of an input signal d and a signal d' obtained by delaying the input signal d by the time corresponding to a ½ bit width as shown in (b) of FIG. 11B, and thereby creates a pulse signal having a ½ bit width as shown in (c) of FIG. 11B which rises at timings at which one signal moves from the mark to the space and the signal moves from the space to the mark.

Then, the rise of the pulse signal having a ½ bit width created in this manner holds as it is jitter information at the rise and the fall corresponding to the input signal d.

Furthermore, the pulse signal having a ½ bit width created in this manner is used in various manners depending on the bit rate of the input signal d as the pulse signal p of the time interval measuring apparatus 20 or as the pulse signals p1 and p2 of the time interval measuring apparatus 20'.

In this case, a difference between the time interval measured by the jitter measuring apparatus 40 and a magnification of an ideal unit interval (UI) which is determined from a reverse number of the bit rate of the input signal d becomes a jitter measurement value.

Incidentally, in the case where the input signal d is a clock signal, only the jitter information included in the rise of the clock signal may be evaluated unlike the case of the data signal described above. In such a case, the creation of the pulse signal having a ½ bit width becomes unnecessary. Depending on the frequency of the input signal d and the frequency band of the A/D converters 23 and 24, the frequency of the input signal d may be appropriately divided to be input to the time interval measuring apparatuses 20 and 20'.

Then, in FIG. 11A, the jitter calculation unit 41 calculates a jitter amount by using an input interval time T of the pulse signal measured by the time interval measuring apparatus 20 according to the first embodiment.

Furthermore, in the case where the time interval measuring apparatus 20 according to the second embodiment is used, the jitter calculation unit 41 calculates a jitter amount by using an input interval time T of the pulse signal p1 for the start of time interval measurement and the pulse signal p2 for the termination of the time interval which are measured by the apparatus 20.

Since the jitter measuring apparatus 40 according to the third embodiment calculates a jitter amount based on the input interval time T measured with a high precision as described above, the precision of the jitter amount is sufficiently high, and a highly precise jitter measurement can be performed.

Consequently, according to the present invention as described above in detail, the problem in the prior art is solved, and consequently, it is possible to provide a time interval measuring apparatus capable of accurately and stably measuring an input interval time of a pulse signal with a high precision, and a jitter measuring apparatus using the time interval measuring apparatus.

The invention claimed is:

1. A time interval measuring apparatus comprising:
   a reference signal generator which generates a reference signal of a sine wave having a predetermined frequency;
   a phase shifter which receives the reference signal generated by the reference signal generator, and outputs a first analog signal and a second analog signal whose phases are shifted each other;
   a first analog/digital (A/D) converter which performs sampling of the first analog signal which is output from the phase shifter at an input timing of a pulse signal for time interval measurement, converts a value obtained by the sampling into a first digital sample value, and outputs the first digital sample value;
   a second A/D converter which performs sampling of the second analog signal which is output from the phase shifter at the input timing of the pulse signal, converts a value obtained by the sampling into a second digital sample value, and outputs the second digital sample value;
   an error correction unit which receives the first digital sample value and the second digital sample value which are output from the first A/D converter and the second A/D converter, and respectively corrects direct current offset errors respectively generated in the first digital sample value and the second digital sample value, and a phase error with respect to 90 degrees and an amplitude error which are generated between the first digital sample value and the second digital sample value, the errors being generated by the phase shifter, the first A/D converter and the second A/D converter;
   an instantaneous phase calculation unit which calculates an instantaneous phase of the reference signal at the input timing of the pulse signal based on the first digital sample value and the second digital sample value in which the errors are already corrected by the error correction unit; and
   an interval time calculation unit which determines a variation of the instantaneous phases from each of the instantaneous phase which is respectively calculated by the instantaneous phase calculation unit at each of the input timing of two of the pulse signals, and determines an input interval time of the pulse signals based on the variation of the instantaneous phases.

2. The time interval measuring apparatus according to claim 1, further comprising:
   a frequency multiplier which receives the reference signal generated by the reference signal generator, and generates a frequency multiplication signal which is obtained by multiplying the frequency of the reference signal by a multiplication number of 3 or more; and
   a counter which counts the frequency multiplication signal output from the frequency multiplier,
   wherein the interval time calculation unit obtains a count value of the counter at the input timing of the pulse signals, determines a variation of count values from each of the count value at each of the input timing of two of the pulse signals, and determines the input interval time of the pulse signals based on the variation of the count values and the variation of the instantaneous phases.

3. A time interval measuring apparatus comprising:
   a reference signal generator which generates a reference signal of a sine wave having a predetermined frequency;
   a phase shifter which receives the reference signal generated by the reference signal generator, and outputs a first analog signal and a second analog signal whose phases are shifted each other;
   a first analog/digital (A/D) converter which performs sampling of the first analog signal which is output from the phase shifter at an input timing of a pulse signal for a start of time interval measurement, converts a value obtained by the sampling into a first digital sample value, and outputs the first digital sample value;
   a second A/D converter which performs sampling of the second analog signal which is output from the phase shifter at the input timing of the pulse signal for the start of time interval measurement, converts a value obtained by the sampling into a second digital sample value, and outputs the second digital sample value;
   a first error correction unit which receives the first digital sample value and the second digital sample value which are output from the first A/D converter and the second A/D converter, and respectively corrects direct current offset errors respectively generated in the first digital sample value and the second digital sample value, and a phase error with respect to 90 degrees and an amplitude error which are generated between the first digital sample value and the second digital sample value, the errors being by the phase shifter, the first A/D converter and the second A/D converter;
   a first instantaneous phase calculation unit which calculates a first instantaneous phase of the reference signal at the input timing of the pulse signal for the start of time interval measurement based on the first digital sample value and the second digital sample value in which the errors are already corrected by the first error correction unit;
   a third A/D converter which performs sampling of the first analog signal which is output from the phase shifter at an input timing of a pulse signal for an end of time interval measurement, converts a value obtained by the sampling into a third digital sample value, and outputs the third digital sample value;
   a fourth A/D converter which performs sampling of the second analog signal which is output from the phase shifter at the input timing of the pulse signal for the end of time interval measurement, converts a value obtained by the sampling into a fourth digital sample value, and outputs the fourth digital sample value;

a second error correction unit which receives the third digital sample value and the fourth digital sample value which are output from the third A/D converter and the fourth A/D converter, and respectively corrects direct current offset errors respectively generated in the third digital sample value and the fourth digital sample value, and a phase error with respect to 90 degrees and an amplitude error which are generated between the third digital sample value and the fourth digital sample value, the errors being generated by the phase shifter, the third A/D converter and the fourth A/D converter;

a second instantaneous phase calculation unit which calculates a second instantaneous phase of the reference signal at the input timing of the pulse signal for the end of time interval measurement based on the third digital sample value and the fourth digital sample value in which the errors are already corrected by the second error correction unit; and an interval time calculation unit which determines as a variation of instantaneous phases a difference between the first instantaneous phase and the second instantaneous phase which are respectively calculated by the first instantaneous phase calculation unit and the second instantaneous phase calculation unit, and determines an input interval time of the pulse signal for the start of time interval measurement and the pulse signal of the end of time interval measurement based on the variation of the instantaneous phases.

4. The time interval measuring apparatus according to claim 3, further comprising:

a frequency multiplier which receives a reference signal generated by the reference signal generator, and generates a frequency multiplication signal which is obtained by multiplying the frequency of the reference signal by a multiplication number of 3 or more; and a counter which counts the frequency multiplication signal output from the frequency multiplier, wherein the interval time calculation unit obtains a first count value from the counter at the input timing of the pulse signal for the start of time interval measurement and a second count value from the counter at the input timing of the pulse signal for the end of time interval measurement, determines a difference between the first count value and the second count value as a variation of the count values, and determines an input interval time of the pulse signal for the start of time interval measurement and the pulse signal for the end of time interval measurement based on the variation of the count values and the variation of the instantaneous phases.

5. The time interval measuring apparatus according to claim 1, wherein the error correction unit comprises:

an offset correction unit which corrects the direct current offset errors respectively generated in the first digital sample value and the second digital sample value which are output from the first A/D converter and the second A/D converter;

a phase correction unit which corrects the phase error with respect to 90 degrees generated between the first digital sample value in which the direct current offset error is already corrected by the offset correction unit and the second digital sample value in which the direct current offset error is already corrected by the offset correction unit; and an amplitude correction unit which corrects the amplitude error generated between the first digital sample value in which the phase error with respect to the 90 degrees is already corrected by the phase correction unit and the second digital sample value in which the phase error with respect to the 90 degrees is already corrected by the phase correction unit.

6. The time interval measuring apparatus according to claim 2, wherein the error correction unit comprises:

an offset correction unit which corrects the direct current offset errors respectively generated in the first digital sample value and the second digital sample value which are output from the first A/D converter and the second A/D converter;

a phase correction unit which corrects the phase error with respect to 90 degrees generated between the first digital sample value in which the direct current offset error is already corrected by the offset correction unit and the second digital sample value in which the direct current offset error is already corrected by the offset correction unit; and an amplitude correction unit which corrects the amplitude error generated between the first digital sample value in which the phase error with respect to the 90 degrees is already corrected by the phase correction unit and the second digital sample value in which the phase error with respect to the 90 degrees is already corrected by the phase correction unit.

7. The time interval measuring apparatus according to claim 3, wherein the first and second error correction units each comprise:

an offset correction unit which corrects the direct current offset errors respectively generated in the first digital sample value and the second digital sample value or in the third digital sample value and the fourth digital sample value which are output from the first A/D converter and the second A/D converter or from the third A/D converter and the fourth A/D converter;

a phase correction unit which corrects the phase error with respect to 90 degrees generated between the first digital sample value in which the direct current offset error is already corrected by the offset correction unit and the second digital sample value in which the direct current offset error is already corrected by the offset correction unit or between the third digital sample value in which the direct current offset error is already corrected by the offset correction unit and the fourth digital sample value in which the direct current offset error is already corrected by the offset correction unit; and an amplitude correction unit which corrects the amplitude error generated between the first digital sample value in which the phase error with respect to the 90 degrees is already corrected by the phase correction unit and the second digital sample value in which the phase error with respect to the 90 degrees is already corrected by the phase correction unit or between the third digital sample value in which the phase error with respect to the 90 degrees is already corrected by the phase correction unit and the fourth digital sample value in which the phase error with respect to the 90 degrees is already corrected by the phase correction unit.

8. The time interval measuring apparatus according to claim 4, wherein the first and second error correction units each comprise:

an offset correction unit which corrects the direct current offset errors respectively generated in the first digital sample value and the second digital sample value or in the third digital sample value and the fourth digital sample value which are output from the first A/D converter and the second A/D converter or from the third A/D converter and the fourth A/D converter;

a phase correction unit which corrects the phase error with respect to 90 degrees generated between the first digital sample value in which the direct current offset error is already corrected by the offset correction unit and the second digital sample value in which the direct current offset error is already corrected by the offset correction unit or between the third digital sample value in which the direct current offset error is already corrected by the offset correction unit and the fourth digital sample value in which the direct current offset error is already corrected by the offset correction unit; and an amplitude correction unit which corrects the amplitude error generated between the first digital sample value in which the phase error with respect to the 90 degrees is already corrected by the phase correction unit and the second digital sample value in which the phase error with respect to the 90 degrees is already corrected by the phase correction unit or between the third digital sample value in which the phase error with respect to the 90 degrees is already corrected by the phase correction unit and the fourth digital sample value in which the phase error with respect to the 90 degrees is already corrected by the phase correction unit.

9. The time interval measuring apparatus according to claim 5, wherein the offset correction unit comprises:

first and second subtractors which respectively receive at each one end thereof the first digital sample value and the second digital sample value which are output from the first A/D converter and the second A/D converter; and first and second calculators which respectively calculate correction values for correcting each of the direct current offset errors by calculation of average values with respect to output values from the first and second subtractors, and supply the correction values to each another end of the first and second subtractors.

10. The time interval measuring apparatus according to claim 9, wherein the phase correction unit comprises:

a third subtractor which receives at one end thereof the first digital sample value in which the direct current offset error is already corrected by the offset correction unit or the second digital sample value in which the direct current offset error is already corrected by the offset correction unit;

a first multiplier which determines a product of an output value corresponding to the first digital sample value in which the direct current offset error is already corrected or an output value corresponding to the second digital sample value in which the direct current offset error is already corrected output from the third subtractor, and the second digital sample value in which the direct current offset error is already corrected or the first digital sample value in which the direct current offset error is already corrected;

a third calculator which determines a first correction coefficient for taking to zero an average value of the product which is output from the first multiplier; and a second multiplier which determines a product of the first correction coefficient determined by the third calculator and the second digital sample value in which the direct current offset error is already corrected or the first digital sample value in which the direct current offset error is already corrected, and outputs the product to another end of the third subtractor.

11. The time interval measuring apparatus according to claim 10, wherein the amplitude correction unit comprises:

a fourth subtractor which receives at one end thereof the first digital sample value in which the phase error with respect to the 90 degrees is already corrected by the phase correction unit or the second digital sample value in which the phase error with respect to the 90 degrees is already corrected by the phase correction unit;

a third multiplier which calculates a square of the first digital sample value in which the phase error with respect to the 90 degrees is already corrected by the phase correction unit or the second digital sample value in which the phase error with respect to the 90 degrees is already corrected by the phase correction unit;

a fourth multiplier which calculates a square of an output value corresponding to the first digital sample value in which the phase error with respect to the 90 degrees is already corrected output from the fourth subtractor or an output value corresponding to the second digital sample value in which the phase error with respect to the 90 degrees is already corrected;

a fifth subtractor which determines a difference between outputs from the third and fourth multipliers;

a fourth calculator which calculates a second correction coefficient for taking to zero an average value of an output from the fifth subtractor; and a fifth multiplier which determines a product of the second correction coefficient determined by the fourth calculator and the first digital sample value in which the phase error with respect to the 90 degrees is already corrected or the second digital sample value in which the phase error with respect to the 90 degrees is already corrected, and outputs the product to another end of the fourth subtractor.

12. The time interval measuring apparatus according to claim 6, wherein the offset correction unit comprises:

sixth and seventh subtractors which respectively receive at each one end thereof the first digital sample value and the second digital sample value which are output from the first A/D converter and the second A/D converter; and fifth and sixth calculators which respectively calculate correction values for correcting the direct current offset errors by calculation of average values with respect to output values from the sixth and seventh subtractors, and supply the correction values to each another end of the sixth and seventh subtractors.

13. The time interval measuring apparatus according to claim 12, wherein the phase correction unit comprises:

an eighth subtractor which receives at one end thereof the first digital sample value in which the direct current offset error is already corrected by the offset correction unit or the second digital sample value in which the direct current offset error is already corrected by the offset correction unit;

a sixth multiplier which determines a product of an output value corresponding to the first digital sample value in which the direct current offset error is already corrected or an output value corresponding to the second digital sample value output from the eighth subtractor, and the second digital sample value in which the direct current offset error is already corrected or the first digital sample value in which the direct current offset error is already corrected;

a seventh calculator which determines a third correction coefficient for taking to zero an average value of the product which is output from the sixth multiplier; and a seventh multiplier which determines a product of the third correction coefficient determined by the seventh calculator and the second digital sample value in which the direct current offset error is already corrected or the first digital sample value in which the direct current offset error is already corrected, and outputs the product to another end of the eighth subtractor.

14. The time interval measuring apparatus according to claim 13, wherein the amplitude correction unit comprises:
a ninth subtractor which receives at one end thereof the first digital sample value in which the phase error with respect to the 90 degrees is already corrected by the phase correction unit or the second digital sample value in which the phase error with respect to the 90 degrees is already corrected by the phase correction unit;
an eighth multiplier which calculates a square of the first digital sample value in which the phase error with respect to the 90 degrees is already corrected by the phase correction unit or the second digital sample value in which the phase error with respect to the 90 degrees is already corrected by the phase correction unit; and
a ninth multiplier which calculates a square of an output value corresponding to the first digital sample value in which the phase error with respect to the 90 degrees is already corrected by the phase correction unit or an output value corresponding to the second digital sample value in which the phase error with respect to the 90 degrees is already corrected by the phase correction unit from the ninth subtractor;
a tenth subtractor which determines a difference between outputs from the eighth and ninth multipliers;
a tenth calculator which determines a fourth correction coefficient for taking to zero an average value of an output from the tenth subtractor; and
a tenth multiplier which determines a product of the fourth correction coefficient determined by the tenth calculator and the first digital sample value in which the phase error with respect to the 90 degrees is already corrected by the phase correction unit or the second digital sample value in which the phase error with respect to the 90 degrees is already corrected by the phase correction unit, and outputs the product to another end of the ninth subtractor.

15. The time interval measuring apparatus according to claim 7, wherein the offset correction unit comprises:
eleventh and twelfth subtractors which respectively receive at each one ends thereof the first digital sample value and the second digital sample value or the third digital sample value and the fourth digital sample value which are output from the first A/D converter and the second A/D converter or from the third A/D converter and the fourth A/D converter; and
ninth and tenth calculators which respectively calculate correction values for correcting the direct current offset errors by calculation of average values with respect to output values from the eleventh and twelfth subtractors, and supply correction values to the respective each another end of the eleventh and twelfth subtractors.

16. The time interval measuring apparatus according to claim 15, wherein the phase correction unit comprises:
a thirteenth subtractor which receives at one end thereof the first digital sample value in which the direct current offset error is already corrected by the offset correction unit or the second digital sample value in which the direct current offset error is already corrected by the offset correction unit or the third digital sample value in which the direct current offset error is already corrected by the offset correction unit or the fourth digital sample value in which the direct current offset error is already corrected by the offset correction unit;
an eleventh multiplier which determines a product of an output value corresponding to the first digital sample value in which the direct current offset error is already corrected output from the thirteenth subtractor or an output value corresponding to the third digital sample value in which the direct current offset error is already corrected or an output value corresponding to the second digital sample value in which the direct current offset error is already corrected or an output value corresponding to the fourth digital sample value in which the direct current offset error is already corrected, and the second digital sample value in which the direct current offset error is already corrected or the fourth digital sample value in which the direct current offset error is already corrected or the first digital sample value in which the direct current offset error is already corrected or the third digital sample value in which the direct current offset error is already corrected;
an eleventh calculator which determines a fifth correction coefficient for taking to zero an average value of the product which is output from the eleventh multiplier; and
a twelfth multiplier which determines a product of the fifth correction coefficient determined by the eleventh calculator and the second digital sample value in which the direct current offset error is already corrected or the fourth digital sample value in which the direct current offset error is already corrected or the first digital sample value in which the direct current offset error is already corrected or the third digital sample value in which the direct current offset error is already corrected, and outputs the product to another end of the thirteenth subtractor.

17. The time interval measuring apparatus according to claim 16, wherein the amplitude correction unit comprises:
a fourteenth subtractor which receives at one end thereof the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;
a thirteenth multiplier which calculates a square of the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;
a fourteenth multiplier which calculates a square of an output value corresponding to the first digital sample value in which the phase error with respect to the 90 degrees is already corrected by the phase correction unit output from the fourteenth subtractor or an output value corresponding to the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

a fifteenth subtractor which determines a difference between outputs from the thirteenth and fourteenth multipliers;

a twelfth calculator which determines a sixth correction coefficient for taking to zero an average value of an output from the fifteenth subtractor; and a fifteenth multiplier which determines a product of the sixth correction coefficient determined by the calculator and the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit, and outputs the product to another end of the fourteenth subtractor.

18. The time interval measuring apparatus according to claim 8, wherein the offset correction unit comprises:

sixteenth and seventeenth subtractors which respectively receive at each one end thereof the first digital sample value and the second digital sample value or the third digital sample value and the fourth digital sample value which are output from the first A/D converter and the second A/D converter or from the third A/D converter and the fourth A/D converter; and thirteenth and fourteenth calculators which respectively calculate correction values for correcting each of the direct current offset errors by calculation of average values with respect to output values from the sixteenth and seventeenth subtractors, and output the correction values to each another end of the sixteenth and seventeenth subtractors.

19. The time interval measuring apparatus according to claim 18, wherein the phase correction unit comprises:

an eighteenth subtractor which receives at one end thereof the first digital sample value in which the direct current offset error is already corrected by the offset correction unit or the second digital sample value in which the direct current offset error is already corrected by the offset correction unit or the third digital sample value in which the direct current offset error is already corrected by the offset correction unit or the fourth digital sample value in which the direct current offset error is already corrected by the offset correction unit;

a sixteenth multiplier which determines a product of an output value corresponding to the first digital sample value in which the direct current offset error is already corrected output from the eighteenth subtractor or an output value corresponding to the third digital sample value in which the direct current offset error is already corrected, and the second digital sample value in which the direct current offset error is already corrected or the fourth digital sample value in which the direct current offset error is already corrected;

a fifteenth calculator which determines a seventh correction coefficient for taking to zero an average value of the product which is output from the sixteenth multiplier; and an eighteenth multiplier which determines a product of the seventh correction coefficient determined by the fifteenth calculator and the second digital sample value in which the direct current offset error is already corrected or the fourth digital sample value in which the direct current offset error is already corrected or the first digital sample value in which the direct current offset error is already corrected or the third digital sample value in which the direct current offset error is already corrected output from the eighteenth subtractor, and output the product to another end of the eighteenth subtractor.

20. The time interval measuring apparatus according to claim 19, wherein the amplitude correction unit comprises:

a nineteenth subtractor which receives at one end thereof the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

an eighteenth multiplier which calculates a square of the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

a nineteenth multiplier which calculates a square of an output value corresponding to the first digital sample value in which the phase error with respect to the 90 degrees is already corrected by the phase correction unit from the nineteenth subtractor or an output value corresponding to the third digital sample value in which the phase error with respect to the 90 degrees is already corrected by the phase correction unit or the second digital sample value in which the phase error with respect to the 90 degrees is already corrected t by the phase correction unit or the fourth digital sample value in which the phase error with respect to the 90 degrees is already corrected by the phase correction unit;

a twentieth subtractor which determines a difference between outputs from the eighteenth and nineteenth multipliers;

a sixteenth calculator which determines an eighth correction coefficient for taking to zero an average value of an output from the twentieth subtractor; and a twentieth multiplier which determines a product of the eighth correction coefficient determined by the sixteenth calculator and the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit, and outputs the product to another end of the nineteenth subtractor.

21. A jitter measuring apparatus comprising:
a time interval measuring apparatus; and
a jitter calculation unit,
wherein the time interval measuring apparatus comprises:
a reference signal generator which generates a reference signal of a sine wave having a predetermined frequency;
a phase shifter which receives the reference signal generated by the reference signal generator, and outputs a first analog signal and a second analog signal whose phases are shifted each other;
a first analog/digital (A/D) converter which performs sampling of the first analog signal which is output from the phase shifter at an input timing of a pulse signal for time interval measurement, converts a value obtained by the sampling into a first digital sample value, and outputs the first digital sample value;
a second A/D converter which performs sampling of the second analog signal which is output from the phase shifter at the input timing of the pulse signal, converts a value obtained by the sampling into a second digital sample value, and outputs the second digital sample value;
an error correction unit which receives the first digital sample value and the second digital sample value which are output from the first A/D converter and the second A/D converter, and respectively corrects direct current offset errors respectively generated in the first digital sample value and the second digital sample value, and a phase error with respect to 90 degrees and an amplitude error which are generated between the first digital sample value and the second digital sample value, the errors being by the phase shifter, the first A/D converter and the second A/D converter;
an instantaneous phase calculation unit which calculates an instantaneous phase of the reference signal at the input timing of the pulse signal based on the first digital sample value and the second digital sample value in which the errors are already corrected by the error correction unit;
an interval time calculation unit which determines a variation of the instantaneous phases from each of the instantaneous phase which is respectively calculated by the instantaneous phase calculation unit at each of the timing of two of the pulse signals, and determines an input interval time of the pulse signals based on the variation of the instantaneous phases, and the jitter calculation unit calculates a jitter amount by using the input interval time of the pulse signal measured by the time interval measuring apparatus.

22. The jitter measuring apparatus according to claim 21, wherein the time interval measuring apparatus further comprises:
a frequency multiplier which receives the reference signal generated by the reference signal generator, and generates a frequency multiplication signal which is obtained by multiplying the frequency of the reference signal by a multiplication number of 3 or more; and
a counter which counts the frequency multiplication signal output from the frequency multiplier,
wherein the interval time calculation unit obtains a count value of the counter at the input timing of the pulse signals, determines a variation of count values from each of count value at each of the input timings of two of the pulse signals with respect to the count value, and determines an input interval time of the pulse signals based on the variation of the count values and the variation of the instantaneous phases.

23. A jitter measuring apparatus comprising:
a time interval measuring apparatus; and
a jitter calculation unit,
wherein the time interval measuring apparatus comprises:
a reference signal generator which generates a reference signal of a sine wave having a predetermined frequency;
a phase shifter which receives the reference signal generated by the reference signal generator, and outputs a first analog signal and a second analog signal whose phases are shifted each other;
a first analog/digital (A/D) converter which performs sampling of the first analog signal which is output from the phase shifter at an input timing of a pulse signal for the start of time interval measurement, converts a value obtained by the sampling into a first digital sample value, and outputs the first digital sample value;
a second A/D converter which performs sampling of the second analog signal which is output from the phase shifter at the input timing of the pulse signal for the start of time interval measurement, converts an value obtained by the sampling into a second digital sample value, and outputs the second digital sample value;
a first error correction unit which receives the first digital sample value and the second digital sample value which are output from the first A/D converter and the second A/D converter, and respectively corrects direct current offset errors respectively generated in the first digital sample value and the second digital sample value, and a phase error with respect to 90 degrees and an amplitude error which are generated between the first digital sample value and the second digital sample value, the errors being by the phase shifter, the first A/D converter and the second A/D converter;
a first instantaneous phase calculation unit which calculates a first instantaneous phase of the reference signal at the input timing of the pulse signal for the start of time interval measurement based on the first digital sample value and the second digital sample value in which the errors are already corrected by the first error correction unit;
a third A/D converter which performs sampling of the first analog signal which is output from the phase shifter at an input timing of a pulse signal for an end of time interval measurement, converts a value obtained by the sampling into a third digital sample value, and outputs the third digital sample value;
a fourth A/D converter which performs sampling of the second analog signal which is output from the phase shifter at the input timing of the pulse signal for the end of time interval measurement, converts an value obtained by the sampling into a fourth digital sample value, and outputs the fourth digital sample value;
a second error correction unit which receives the third digital sample value and the fourth digital sample value which are output from the third A/D converter and the fourth A/D converter, and respectively corrects direct current offset errors respectively generated in the third digital sample value and the fourth digital sample value, and a phase error with respect to 90 degrees and an amplitude error which are generated between the third digital sample value and the fourth digital sample value, the errors being generated by the phase shifter, the third A/D converter and the fourth A/D converter;

a second instantaneous phase calculation unit which calculates a second instantaneous phase of the reference signal at the input timing of the pulse signal for the end of time interval measurement based on the third digital sample value and the fourth digital sample value in which the errors are already corrected by the second error correction unit; and an interval time calculation unit which determines as a variation of instantaneous phases a difference between the first instantaneous phase and the second instantaneous phase respectively calculated by the first instantaneous phase calculation unit and the second instantaneous phase calculation unit, and determines an input interval time of the pulse signal for the start of time interval measurement and the pulse signal for the end of time interval measurement based on the variation of the instantaneous phases, and the jitter calculation unit calculates a jitter amount by using the input interval time of the pulse signal for the start of time interval measurement and the pulse signal for the end of time interval measurement measured by the time interval measuring apparatus.

24. The jitter measuring apparatus according to claim 23, wherein the time interval measuring apparatus further comprises:

a frequency multiplier which receives the reference signal generated by the reference signal generator, and generates a frequency multiplication signal which is obtained by multiplying the frequency of the reference signal by a multiplication number of 3 or more; and a counter which counts the frequency multiplication signal output from the frequency multiplier, wherein the interval time calculation unit obtains a first count value from the counter at the input timing of the pulse signal for the start of time interval measurement and a second count value from the counter at the input timing of the pulse signal for the end of time interval measurement, determines a difference between the first count value and the second count value as a variation of count values, and determines an input interval time of the pulse signal for the start of time interval measurement and the pulse signal for the end of time interval measurement based on the variation of the count values and the variation of the instantaneous phases.

25. The jitter measuring apparatus according to claim 21, wherein the error correction unit of the time interval measuring apparatus comprises:

an offset correction unit which corrects the direct current offset errors respectively generated in the first digital sample value and the second digital sample value which are output from the first A/D converter and the second A/D converter;

a phase correction unit which corrects the phase error with respect to 90 degrees generated between the first digital sample value and the second digital sample value in which each of the direct current offset error is corrected by the offset correction unit; and an amplitude correction unit which corrects the amplitude error generated between the first digital sample value and the second digital sample value in which the phase error with respect to the 90 degrees is already corrected by the phase correction unit.

26. The jitter measuring apparatus according to claim 22, wherein the error correction unit of the time interval measuring apparatus comprises:

an offset correction unit which corrects the direct current offset errors respectively generated in the first digital sample value and the second digital sample value which are output from the first A/D converter and the second A/D converter;

a phase correction unit which corrects the phase error with respect to 90 degrees generated between the first digital sample value and the second digital sample value in which each of the direct current offset error is already corrected by the offset correction unit; and an amplitude correction unit which corrects the amplitude error generated between the first digital sample value and the second digital sample value in which the phase error with respect to the 90 degrees is already corrected by the phase correction unit.

27. The jitter measuring apparatus according to claim 23, wherein the first and second error correction units of the time interval measuring apparatus each comprises:

an offset correction unit which corrects the direct current offset errors respectively generated in the first digital sample value and the second digital sample value or in the third digital sample value and the fourth digital sample value which are output from the first A/D converter and the second A/D converter or from the third A/D converter and the fourth A/D converter;

a phase correction unit which corrects a phase error with respect to 90 degrees generated between the first digital sample value and the second digital sample value in which each of the direct current offset errors is already corrected by the offset correction unit or the third digital sample value and the fourth digital sample value in which each of the direct current offset errors is already corrected by the offset correction unit; and an amplitude correction unit which corrects the amplitude error generated between the first digital sample value and the second digital sample value in which the phase error with respect to the 90 degrees is already corrected by the phase correction unit or the third digital sample value and the fourth digital sample value in which the phase error with respect to the 90 degrees is already corrected by the phase correction unit.

28. The jitter measuring apparatus according to claim 24, wherein the first and second error correction units of the time interval measuring apparatus each comprise:

an offset correction unit which corrects the direct current offset errors respectively generated in the first digital sample value and the second digital sample value or in the third digital sample value and the fourth digital sample value which are output from the first A/D converter and the second A/D converter or from the third A/D converter and the fourth A/D converter;

a phase correction unit which corrects the phase error with respect to 90 degrees generated between the first digital sample value and the second digital sample value in which each of the direct current offset errors is already corrected by the offset correction unit or the third digital sample value and the fourth digital sample value in which each of the direct current offset errors is already corrected by the offset correction unit; and an amplitude correction unit which corrects the amplitude error generated between the first digital sample value and the second digital sample value in which the phase error with respect to the 90 degrees is already corrected by the phase correction unit or the third digital sample value and the fourth digital sample value in which the phase error with respect to the 90 degrees is already corrected by the phase correction unit.

29. The jitter measuring apparatus according to claim 25, wherein the offset correction unit of the error correction unit of the time interval measuring apparatus comprises:

first and second subtractors which respectively receive at each one end thereof the first digital sample value and the second digital sample value which are output from the first A/D converter and the second A/D converter; and first and second calculators which respectively calculate correction values for correcting each of the direct current offset errors by calculation of average values with respect to output values from the first and second subtractors, and supply the correction values to each another end of the first and second subtractors.

30. The jitter measuring apparatus according to claim 28, wherein the phase correction unit of the error correction unit of the time interval measuring apparatus comprises:

a third subtractor which receives at one end thereof the first digital sample value in which the direct current offset error is already corrected by the offset correction unit or the second digital sample value in which the direct current offset error is already corrected by the offset correction unit;

a first multiplier which determines a product of an output value corresponding to the first digital sample value in which the direct current offset error is already corrected or an output value corresponding to the second digital sample value in which the direct current offset error is already corrected output from the third subtractor, and the second digital sample value in which the direct current offset error is already corrected or the first digital sample value in which the direct current offset error is already corrected;

a third calculator which determines a first correction coefficient for taking to zero an average value of the product which is output from the first multiplier; and a second multiplier which determines a product of the first correction coefficient determined by the third calculator and the second digital sample value in which the direct current offset error is already corrected or the first digital sample value in which the direct current offset error is already corrected, and outputs the product to another end of the third subtractor.

31. The jitter measuring apparatus according to claim 30, wherein the amplitude correction unit of the error correction unit of the time interval measuring apparatus comprises:

a fourth subtractor which receives at one end thereof the first digital sample value in which the phase error with respect to the 90 degrees is already corrected by the phase correction unit or the second digital sample value in which the phase error with respect to the 90 degrees is already corrected by the phase correction unit;

a third multiplier which calculates a square of the first digital sample value in which the phase error with respect to the 90 degrees is already corrected by the phase correction unit or the second digital sample value in which the phase error with respect to the 90 degrees is already corrected by the phase correction unit;

a fourth multiplier which calculates a square of an output value corresponding to the first digital sample value in which the phase error with respect to the 90 degrees is already corrected from the fourth subtractor or an output value corresponding to the second digital sample value in which the phase error with respect to the 90 degrees is already corrected a fifth subtractor which determines a difference between outputs from the third and fourth multipliers;

a fourth calculator which calculates a second correction coefficient for taking to zero an average value of an output from the fifth subtractor; and a fifth multiplier which determines a product of the second correction coefficient determined by the fourth calculator and the first digital sample value in which the phase error with respect to the 90 degrees is already corrected or the second digital sample value in which the phase error with respect to the 90 degrees is already corrected, and outputs the product to another end of the fourth subtractor.

32. The jitter measuring apparatus according to claim 26, wherein the offset correction unit of the error correction unit of the time interval measuring apparatus comprises:

sixth and seventh subtractors which respectively receive at each one end thereof the first digital sample value and the second digital sample value which are output from the first A/D converter and the second A/D converter; and fifth and sixth calculators which respectively calculate correction values for correcting each of the direct current offset errors by calculation of average values with respect to output values from the sixth and seventh subtractors, and supply the correction values to each another end of the sixth and seventh subtractors.

33. The jitter measuring apparatus according to claim 32, wherein the phase correction unit of the error correction unit of the time interval measuring apparatus comprises:

an eighth subtractor which receives at one end thereof the first digital sample value in which the direct current offset error is already corrected by the offset correction unit or the second digital sample value in which the direct current offset error is already corrected by the offset correction unit;

a sixth multiplier which determines a product of an output value corresponding to the first digital sample value in which the direct current offset error is already corrected or an output value corresponding to the second digital sample value output from the eighth subtractor, and the second digital sample value in which the direct current offset error is already corrected or the first digital sample value in which the direct current offset error is already corrected;

a seventh calculator which determines a third correction coefficient for taking to zero an average value of the product which is output from the sixth multiplier; and a seventh multiplier which determines a product of the third correction coefficient determined by the seventh calculator and the second digital sample value in which the direct current offset error is already corrected or the first digital sample value in which the direct current offset error is already corrected, and outputs the product to another end of the eighth subtractor.

34. The jitter measuring apparatus according to claim 33, wherein the amplitude correction unit of the error correction unit of the time interval measuring apparatus comprises:

a ninth subtractor which receives at one end thereof the first digital sample value in which the phase correction error with respect to the 90 degrees is already corrected by the phase correction unit or the second digital sample value in which the phase correction error with respect to the 90 degrees is already corrected by the phase correction unit;

an eighth multiplier which calculates a square of the first digital sample value in which the phase correction error with respect to the 90 degrees is already corrected by the phase correction unit or the second digital sample value in which the phase correction error with respect to the 90 degrees is already corrected by the phase correction unit; and a ninth multiplier which calculates a square of an output value corresponding to the first digital sample value in which the phase correction error with respect to the 90 degrees is already corrected by the phase correction unit output from the ninth subtractor or an output value corresponding to the second digital sample value in which the phase correction error with respect to the 90 degrees is already corrected by the phase correction unit;

a tenth subtractor which determines a difference between outputs from the eighth and ninth multipliers;

a tenth calculator which determines a fourth correction coefficient for taking to zero an average value of an output from the tenth subtractor; and a tenth multiplier which determines a product of the fourth correction coefficient determined by the tenth calculator and the first digital sample value in which the phase correction error with respect to the 90 degrees is already corrected by the phase correction unit or the second digital sample value in which the phase correction error with respect to the 90 degrees is already corrected by the phase correction unit, and outputs the product to another end of the ninth subtractor.

35. The jitter measuring apparatus according to claim 27, wherein the offset correction unit of the error correction unit of the time interval measuring apparatus comprises:

eleventh and twelfth subtractors which respectively receive at each one end thereof the first digital sample value and the second digital sample value or the third digital sample value and the fourth digital sample value which are output from the first A/D converter and the second A/D converter or from the third A/D converter and the fourth A/D converter; and ninth and tenth calculators which respectively calculate correction values for correcting each of the direct current offset errors by calculation of average values with respect to output values from the eleventh and twelfth subtractors, and supply correction values to the respective each another end of the eleventh and twelfth subtractors.

36. The jitter measuring apparatus according to claim 35, wherein the phase correction unit of the error correction unit of the time interval measuring apparatus comprises:

a thirteenth subtractor which receives at one end thereof the first digital sample value in which the direct current offset error is already corrected by the offset correction unit or the second digital sample value in which the direct current offset error is already corrected by the offset correction unit or the third digital sample value in which the direct current offset error is already corrected by the offset correction unit or the fourth digital sample value in which the direct current offset error is already corrected by the offset correction unit;

an eleventh multiplier which determines a product of an output value corresponding to the first digital sample value in which the direct current offset error is already corrected output from the thirteenth subtractor or an output value corresponding to the third digital sample value in which the direct current offset error is already corrected or an output value corresponding to the second digital sample value in which the direct current offset error is already corrected by the offset correction unit or an output value corresponding to the fourth digital sample value in which the direct current offset error is already corrected by the offset correction unit, and the second digital sample value in which the direct current offset error is already corrected by the offset correction unit or the fourth digital sample value in which the direct current offset error is already corrected by the offset correction unit or the first digital sample value in which the direct current offset error is already corrected by the offset correction unit or the third digital sample value in which the direct current offset error is already corrected by the offset correction unit;

an eleventh calculator which determines a fifth correction coefficient for taking to zero an average value of the product which is output from the eleventh multiplier; and a twelfth multiplier which determines a product of the fifth correction coefficient determined by the eleventh calculator and the second digital sample value in which the direct current offset error is already corrected or the fourth digital sample value in which the direct current offset error is already corrected or the first digital sample value in which the direct current offset error is already corrected or the third digital sample value in which the direct current offset error is already corrected, and outputs the product to another end of the thirteenth subtractor.

37. The jitter measuring apparatus according to claim 36, wherein the amplitude correction unit of the phase correction unit of the time interval measuring apparatus comprises:

a fourteenth subtractor which receives at one end thereof the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

a thirteenth multiplier which calculates a square of the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

a fourteenth multiplier which calculates a square of an output value corresponding to the first digital sample value in which the phase error with respect to the 90 degrees is already corrected by the phase correction unit or an output value corresponding to the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit output from the fourteenth subtractor;

a fifteenth subtractor which determines a difference between outputs from the thirteenth and fourteenth multipliers;

a twelfth calculator which determines a sixth correction coefficient for taking to zero an average value of an output from the fifteenth subtractor; and a fifteenth multiplier which determines a product of the sixth correction coefficient determined by the calculator and the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit, and outputs the product to another end of the fourteenth subtractor.

38. The jitter measuring apparatus according to claim 28, wherein the offset correction unit of the error correction unit of the time interval measuring apparatus comprises:

sixteenth and seventeenth subtractors which respectively receive at each one end thereof the first digital sample value and the second digital sample value or the third digital sample value and the fourth digital sample value which are output from the first A/D converter and the second A/D converter or from the third A/D converter and the fourth A/D converter; and thirteenth and fourteenth calculators which respectively calculate correction values for correcting each of the direct current offset error by calculation of average values with respect to output values from the sixteenth and seventeenth subtractors, and output the correction values to each another end of the sixteenth and seventeenth subtractors.

39. The jitter measuring apparatus according to claim 38, wherein the phase correction unit of the error correction unit of the time interval measuring apparatus comprises:

an eighteenth subtractor which receives at one end thereof the first digital sample value in which the direct current offset error is already corrected by the offset correction unit or the second digital sample value in which the direct current offset error is already corrected by the offset correction unit or the third digital sample value in which the direct current offset error is already corrected by the offset correction unit or the fourth digital sample value in which the direct current offset error is already corrected by the offset correction unit;

a sixteenth multiplier which determines a product of an output value corresponding to the first digital sample value in which the direct current offset error is already corrected output from the eighteenth subtractor or an output value corresponding to the third digital sample value in which the direct current offset error is already corrected, and the second digital sample value in which the direct current offset error is already corrected or the fourth digital sample value in which the direct current offset error is already corrected;

a fifteenth calculator which determines a seventh correction coefficient for taking to zero an average value of the product which is output from the sixteenth multiplier; and a seventeenth multiplier which determines a product of the seventh correction coefficient determined by the fifteenth calculator and the second digital sample value in which the direct current offset error is already corrected or the fourth digital sample value in which the direct current offset error is already corrected or the first digital sample value in which the direct current offset error is already corrected or the third digital sample value in which the direct current offset error is already corrected, and outputs the product to another end of the eighteenth subtractor.

40. The jitter measuring apparatus according to claim 39, wherein the amplitude correction unit of the phase correction unit of the time interval measuring apparatus comprises:

a nineteenth subtractor which receives at one end thereof the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

an eighteenth multiplier which calculates a square of the first digital sample value in which the phase error with respect to the 90 degrees is already corrected by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

a nineteenth multiplier which calculates a square of an output value corresponding to the first digital sample value in which the phase error with respect to the 90 degrees is already corrected by the phase correction unit output from the nineteenth subtractor or an output value corresponding to the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit;

a twentieth subtractor which determines a difference between outputs from the eighteenth and nineteenth multipliers;

a sixteenth calculator which determines an eighth correction coefficient for taking to zero an average value of an output from the twentieth subtractor; and a twentieth multiplier which determines a product of the eighth correction coefficient determined by the sixteenth calculator and the first digital sample value which is corrected the phase error with respect to the 90 degrees by the phase correction unit or the third digital sample value in which the phase error with respect to the 90 degrees is already corrected by the phase correction unit or the second digital sample value in which the phase error with respect to the 90 degrees is already corrected by the phase correction unit or the fourth digital sample value in which the phase error with respect to the 90 degrees is already corrected by the phase correction unit, and outputs the product to another end of the nineteenth subtractor.

* * * * *